United States Patent
Fujiwara et al.

(10) Patent No.: US 9,938,371 B2
(45) Date of Patent: Apr. 10, 2018

(54) COMPOSITION FOR HEAT-DISSIPATION MEMBER, HEAT-DISSIPATION MEMBER, AND ELECTRONIC DEVICE

(71) Applicants: JNC CORPORATION, Tokyo (JP); Osaka Municipal Technical Research Institute, Osaka (JP)

(72) Inventors: Takeshi Fujiwara, Chiba (JP); Jyunichi Inagaki, Chiba (JP); Yukito Yada, Chiba (JP); Akinori Okada, Osaka (JP); Yasuyuki Agari, Osaka (JP); Hiroshi Hirano, Osaka (JP); Joji Kadota, Osaka (JP)

(73) Assignees: JNC CORPORATION, Tokyo (JP); OSAKA RESEARCH INSTITUTE OF INDUSTRIAL SCIENCE AND TECHNOLOGY, Osaka-Fu (JP)

( * ) Notice: Subject to any disclaimer, the term of this patent is extended or adjusted under 35 U.S.C. 154(b) by 0 days.

(21) Appl. No.: 15/309,793

(22) PCT Filed: May 8, 2015

(86) PCT No.: PCT/JP2015/063316
§ 371 (c)(1),
(2) Date: Dec. 26, 2016

(87) PCT Pub. No.: WO2015/170744
PCT Pub. Date: Nov. 12, 2015

(65) Prior Publication Data
US 2017/0137561 A1   May 18, 2017

(30) Foreign Application Priority Data
May 9, 2014 (JP) .................. 2014-098190

(51) Int. Cl.
*H01L 23/34* (2006.01)
*C08G 59/24* (2006.01)
(Continued)

(52) U.S. Cl.
CPC ....... *C08G 59/245* (2013.01); *C08G 59/5033* (2013.01); *C08K 3/38* (2013.01);
(Continued)

(58) Field of Classification Search
CPC ......... H01L 23/3737; C09K 5/14; C08K 3/38; C08K 9/06; C08G 59/245; C08G 59/5033
(Continued)

(56) References Cited

FOREIGN PATENT DOCUMENTS

| JP | 2004-175926 | 6/2004 |
|----|-------------|--------|
| JP | 2006-265527 | 10/2006 |

(Continued)

OTHER PUBLICATIONS

"International Search Report (Form PCT/ISA/210) of PCT/JP2015/063316", dated Jul. 28, 2015, with English translation thereof, pp. 1-4.

*Primary Examiner* — Luan C Thai
(74) *Attorney, Agent, or Firm* — JCIPRNET

(57) ABSTRACT

A composition capable of forming a heat-dissipation member having high thermal conductivity, and a heat-dissipation member. The composition for the heat-dissipation member of the present application contains a polymerizable liquid crystal compound having, at both terminals, a structure including an oxiranyl group or an oxetanyl group; a curing agent that cures the polymerizable liquid crystal compound; and an inorganic filler formed of nitride. A curing temperature of the composition for the heat-dissipation member is within or higher than the temperature range in which the polymerizable liquid crystal compound exhibits a liquid crystal phase, and within or lower than the temperature
(Continued)

range in which the polymerizable liquid crystal compound exhibits an isotropic phase. The heat-dissipation member formed of such a composition can have excellent thermal conductivity owing to a synergistic effect between alignment of the liquid crystal compound and the inorganic filler formed of nitride.

8 Claims, 4 Drawing Sheets

(51) Int. Cl.
  H01L 23/373 (2006.01)
  C08K 3/38 (2006.01)
  C08K 9/06 (2006.01)
  C08G 59/50 (2006.01)
  C09K 5/14 (2006.01)

(52) U.S. Cl.
  CPC .......... *C08K 9/06* (2013.01); *C09K 5/14* (2013.01); *H01L 23/3737* (2013.01); *C08K 2003/385* (2013.01)

(58) Field of Classification Search
  USPC ........................................ 257/712
  See application file for complete search history.

(56) References Cited

FOREIGN PATENT DOCUMENTS

| | | | |
|---|---|---|---|
| JP | 2006265527 A | * | 10/2006 |
| JP | 2008-507594 | | 3/2008 |
| JP | 2011-236376 | | 11/2011 |
| JP | 2013-227451 | | 11/2013 |
| JP | 2013227451 A | * | 11/2013 |
| WO | 2012098735 | | 7/2012 |

* cited by examiner

COMPOSITION FOR HEAT-DISSIPATION MEMBER, HEAT-DISSIPATION MEMBER, AND ELECTRONIC DEVICE

CROSS-REFERENCE TO RELATED APPLICATION

This application is a 371 application of the international PCT application serial no. PCT/JP2015/063316, filed on May 8, 2015, which claims the priority benefit of Japan application no. 2014-098190, filed on May 9, 2014. The entirety of each of the above-mentioned patent applications is hereby incorporated by reference herein and made a part of this specification.

TECHNICAL FIELD

The invention relates to a composition for a heat-dissipation member. In particular, the invention relates to a composition for the heat-dissipation member, from which the heat-dissipation member for efficiently conducting and transmitting heat generated inside Electronic equipment can be formed.

BACKGROUND ART

In recent years, in a semiconductor device for controlling power in a hybrid vehicle, or an electric vehicle, or in a CPU for a high speed computer, or the like, achievement of high thermal conduction in a package material has been desired to avoid an excessive increase in a temperature of a semiconductor thereinside. More specifically, capability of effectively dissipating heat generated from a semiconductor chip to an outside has become important.

Specific examples of a method for solving such an issue of heat dissipation include a method for dissipating heat by bringing a high thermal conductive material (heat-dissipation member) into contact with a heat generation site to lead heat to an outside. Specific examples of the high thermal conductive material include an inorganic material such as metal and metal oxide. However, such an inorganic material has a problem in processability, insulation or the like, and is significantly difficult in single use as a packing material of a semiconductor package. Therefore, development has been made on the heat-dissipation member in which a composite of the inorganic materials and a resin is formed to achieve high thermal conduction.

The high thermal conduction of a resin composite material has been generally achieved by adding a large amount of a metallic filler or an inorganic filler to a general-purpose resin such as a polyethylene resin, a polyamide resin, a polystyrene resin, an acrylic resin and an epoxy resin. However, thermal conductivity of the inorganic filler is a value inherent to a substance, and has an upper limit. Therefore, an attempt has been widely made on a method for improving thermal conductivity of a resin to achieve bottom-up of the thermal conductivity of the composite material.

Patent literature No. 1 discloses a heat-dissipation member obtained by polymerizing a liquid crystal composition by performing alignment control by an alignment control additive or by a rubbing treatment method or the like as a method for improving the thermal conductivity of the resin.

CITATION LIST

Patent Literature

Patent literature No. 1: JP 2006-265527 A.

SUMMARY OF INVENTION

Technical Problem

As described above, a heat-dissipation member is desired to achieve further highly effective thermal conduction at all times in connection with development of electronic equipment.

Therefore, the invention is contemplated for providing a composition from which the heat-dissipation member having high thermal conductivity can be formed and the heat-dissipation member.

Solution to Problem

The present inventors have attempted to achieve further high thermal conduction by utilizing performance of a heat-dissipation member formed of a polymer obtained by polymerizing a polymerizable compound having liquid crystallinity by allowing a mesogen moiety thereof to be aligned in a predetermined direction and having immobilized molecular arrangement, in which conduction loss of phonons being a main element of thermal conduction is suppressed, and achievement of high thermal conduction of a resin can be expected. The present inventors have found that, if a composite is formed with a specific highly heat-conductive inorganic filler upon developing a liquid crystal phase of a resin containing a monomer having such a mesogen moiety, and polymerizing the polymerizable monomer, a composite material having a significantly high thermal conductivity can be realized owing to a synergistic effect of a combination thereof, and have completed the invention.

A composition for a heat-dissipation member according to a first aspect of the invention contains a polymerizable liquid crystal compound having, at both terminals, a structure including an oxiranyl group or an oxetanyl group; a curing agent that cures the polymerizable liquid crystal compound; and an inorganic filler formed of nitride, in which curing temperature is within or higher than the temperature range in which the polymerizable liquid crystal compound exhibits a liquid crystal phase, and within or lower than the temperature range in which the polymerizable liquid crystal compound exhibits an isotropic phase. "Temperature range in which the compound exhibits a liquid crystal phase" means the temperature range in which the compound exhibits a nematic phase, a smectic phase or a cholesteric phase.

If the composition is formed in such a manner, the composition for the heat-dissipation member is cured within the temperature range in which the polymerizable liquid crystal compound exhibits the liquid crystal phase and the isotropic phase. More specifically, such a composition is formed in which polymerization can be caused in a state of having fluidity, and further the polymerizable liquid crystal compound can be polymerized in a state in which the polymerizable liquid crystal compound is aligned (state in which molecules are aligned in one direction), and the resulting polymer can be cured with the inorganic filler.

Even when polymerization temperature becomes higher than a temperature region in which the compound exhibits the liquid crystal phase into a temperature region in which the compound exhibits the isotropic phase, the mesogen moiety develops high alignability during cooling. Accordingly, a membrane (heat-dissipation member) formed from the composition for the heat-dissipation member can have high thermal conductivity owing to the synergistic effect between thermal conductivity of the polymerized liquid crystal compound and thermal conductivity of the inorganic filler formed by nitride.

In a composition for a heat-dissipation member according to a second aspect of the invention, the polymerizable liquid crystal compound is at least one kind of compound represented by formula (1-1) described below, in the composition for the heat-dissipation member according to the first aspect of the invention.

$$R^{a1}-Z-(A-Z)_{m1}-R^{a1} \quad (1\text{-}1)$$

In formula (1-1) described above, $R^{a1}$ each is a polymerizable group represented by any one of formulas (2-1) to (2-2) described below;

A is 1,4-cyclohexylene, 1,4-cyclohexenylene, 1,4-phenylene, naphthalene-2,6-diyl, tetrahydronaphthalene-2,6-diyl, fluorene-2,7-diyl, bicyclo[2.2.2]oct-1,4-diyl or bicyclo[3.1.0]hex-3,6-diyl, and in the rings, arbitrary —$CH_2$— may be replaced by —O—, arbitrary —CH= may be replaced by —N=, and arbitrary hydrogen may be replaced by halogen, alkyl having 1 to 10 carbons or alkyl halide having 1 to 10 carbons, and in the alkyl, arbitrary —$CH_2$— may be replaced by —O—, —CO—, —COO— or —OCO—, and arbitrary —$CH_2CH_2$— may be replaced by —CH=CH— or —C≡C—;

Z each is a single bond or alkylene having 1 to 20 carbons, and in the alkylene, arbitrary —$CH_2$— may be replaced by —O—, —S—, —CO—, —COO— or —OCO—, arbitrary —$CH_2CH_2$— may be replaced by —CH=CH—, —CF=CF—, —CH=N—, —N=CH—, —N=N—, —N(O)=N— or —C≡C—, and arbitrary hydrogen may be replaced by halogen; and m1 is an integer from 1 to 6.

Formula 1

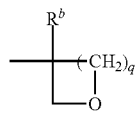

(2-1)

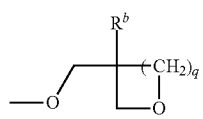

(2-2)

In formulas (2-1) to (2-2), $R^b$ is hydrogen, halogen, —$CF_3$ or alkyl having 1 to 5 carbons, and q is 0 or 1.

If the composition is formed in such a manner, the composition for the heat-dissipation member can contain a further preferred compound as the polymerizable liquid crystal compound. The compounds are thermosettable, and can be cured without being influenced by an amount of the filler, and further are excellent in heat resistance. Moreover, the compounds are considered to be advantageous for conduction of phonons because molecular structure has symmetry and linearity.

In a composition for a heat-dissipation member according to a third aspect of the invention, in formula (1-1) described above, A is 1,4-cyclohexylene, 1,4-cyclohexylene in which arbitrary hydrogen is replaced by halogen, 1,4-phenylene, 1,4-phenylene in which arbitrary hydrogen is replaced by halogen or a methyl group, fluorene-2,7-diyl, or fluorene-2,7-diyl in which arbitrary hydrogen is replaced by halogen or a methyl group in the composition for the heat-dissipation member according to the second aspect of the invention.

If the composition is formed in such a manner, the composition for the heat-dissipation member can contain a still further preferred compound as the polymerizable liquid crystal compound. The compounds are considered to be further advantageous for conduction of phonons because linearity of molecules becomes higher.

In a composition for a heat-dissipation member according to a fourth aspect of the invention, in formula (1-1) described above, Z is a single bond, —$(CH_2)_a$—, —$O(CH_2)_a$—, —$(CH_2)_aO$—, —$O(CH_2)_aO$—, —CH=CH—, —C≡C—, —COO—, —OCO—, —CH=CH—COO—, —OCO—CH=CH—, —$CH_2CH_2$—COO—, —OCO—$CH_2CH_2$—, —CH=N—, —N=CH—, —N=N—, —$OCF_2$— or —$CF_2O$—, where the relevant a is an integer from 1 to 20, in the composition for the heat-dissipation member according to the third aspect of the invention.

If the composition is formed in such a manner, the composition for the heat-dissipation member can contain a particularly preferred compound as the polymerizable liquid crystal compound. The compounds are preferred because of excellence in physical properties, ease of production or ease of handling.

In a composition for a heat-dissipation member according to a fifth aspect of the invention, the inorganic filler is at least one selected from boron nitride, aluminum nitride and silicon nitride, in the composition for the heat-dissipation member according to any one of the first aspect to the fourth aspect of the invention.

If the composition is formed in such a manner, the composition for the heat-dissipation member can contain a still further preferred compound as the inorganic filler.

In a composition for a heat-dissipation member according to a sixth aspect of the invention, the curing agent is at least one kind of diamine compound represented by formula (3-1) described below, in the composition for the heat-dissipation member according to any one of the first aspect to the fifth aspect of the invention.

$$H_2N-Z-(A-Z)_{m2}-NH_2 \quad (3\text{-}1)$$

In formula (3-1) described above,

A is 1,4-cyclohexylene or 1,4-phenylene, and arbitrary hydrogen in the rings may be replaced by halogen or alkyl having 1 to 10 carbons;

Z each is a single bond or alkylene having 1 to 10 carbons; and m2 is an integer from 1 to 7.

If the composition is formed in such a manner, the composition for the heat-dissipation member can contain a still further preferred compound as the curing agent. In particular, when m2 is even, the diamine compound can cure the polymerizable liquid crystal compound without adversely affecting liquid crystallinity of the polymerizable liquid crystal compound, and therefore is preferred.

In a composition for a heat-dissipation member according to a seventh aspect of the invention, the inorganic filler is a filler treated with a coupling agent, or a filler subjected to coupling treatment and then surface modification with the polymerizable liquid crystal compound, in the composition for the heat-dissipation member according to any one of the first aspect to the sixth aspect of the invention. "Surface modification" means that the polymerizable liquid crystal compound is further bonded to the coupling agent bonded to the filler subjected to coupling treatment.

If the composition is formed in such a manner, the compound is preferred because higher thermal conductivity can be obtained in a thickness direction in the heat-dissipation member prepared using the filler subjected to coupling treatment and the filler subjected to surface modification.

A heat-dissipation member according to an eighth aspect of the invention is a heat-dissipation member obtained by applying alignment treatment to the composition for the heat-dissipation member according to any one of the first aspect to the seventh aspect of the invention, and then curing the resulting material to contain 20 to 95% by weight of the inorganic filler.

If the composition is formed in such a manner, the heat-dissipation member can have high thermal conductivity owing to the synergistic effect between thermal conductivity of the polymerized liquid crystal compound and thermal conductivity of the inorganic filler formed by nitride.

Electronic equipment according to a ninth aspect of the invention has the heat-dissipation member according to the eighth aspect of the invention; and an electronic device having a heating unit; in which the heat-dissipation member is arranged in the electronic device in such a manner that the heat-dissipation member is brought into contact with the heating unit.

If the composition is formed in such a manner, heat generated in the electronic device can be efficiently conducted by the heat-dissipation member having high thermal conductivity.

Advantageous Effects of Invention

A heat-dissipation member formed of a composition for a heat-dissipation member according to the invention has high thermal conductivity. Further, the heat-dissipation member also has excellent characteristics such as chemical stability, heat resistance, hardness and mechanical strength. The heat-dissipation member is suitable for a heat-dissipation plate, a heat-dissipation sheet, a heat-dissipation coating film, a heat-dissipation adhesive or the like, for example.

BRIEF DESCRIPTION OF DRAWINGS

FIGS. 3(a) and 3(b) are graphs each showing a relationship between a volume fraction (horizontal axis) of a filler and thermal conductivity (vertical axis) thereof for a heat-dissipation member containing an unmodified filler or a filler treated with a coupling agent, in which FIG. 3(a) shows thermal conductivity in an x-y direction, and FIG. 3(b) shows thermal conductivity in a thickness direction.

FIGS. 4(a) and 4(b) are graphs each showing a relationship between a volume fraction (horizontal axis) of a filler and thermal conductivity (vertical axis) thereof for a heat-dissipation member containing an unmodified filler or a filler subjected to treatment with a coupling agent and then surface modification with a liquid crystalline epoxy, in which FIG. 4(a) shows thermal conductivity in an x-y direction, and FIG. 4(b) shows thermal conductivity in a thickness direction.

DESCRIPTION OF EMBODIMENTS

Figure 1:
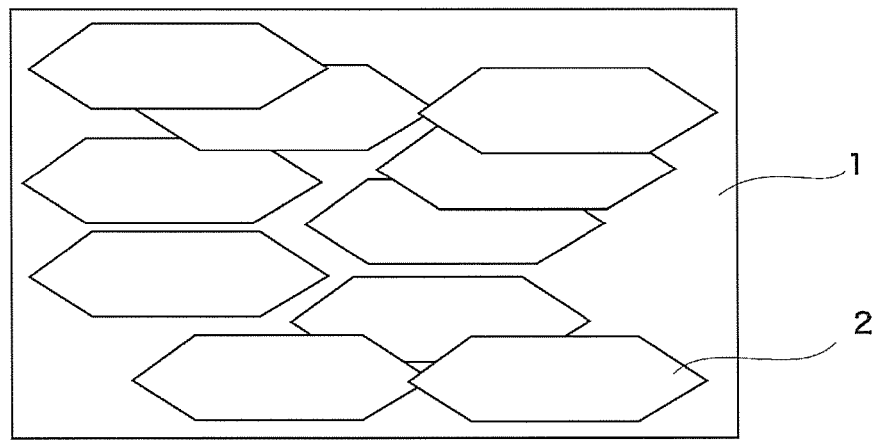
FIG. 1 is an illustrative view showing a case where boron nitride is used as a filler.

The present application is based on Japanese Patent Application No. 2014-098190 filed on May 9, 2014, in Japan, and is hereby incorporated by reference in its entirety in the present application. The invention may be further completely understood by the detailed description described below. A further application scope of the invention will become apparent by the detailed description described below. However, the detailed description and a specific embodiment are desirable embodiments of the invention, and described only for illustrative purposes because various possible changes and modifications will be apparent to those having ordinary skill in the art on the basis of the detailed description within spirit and the scope of the invention. The applicant has no intention to dedicate to the public any described embodiment, and among the modifications and alternatives, those which may not literally fall within the scope of the present claims constitute a part of the invention in the sense of the doctrine of equivalents.

Hereinafter, an embodiment of the invention will be described with reference to drawings. In addition, in each Figure, an identical or similar sign is placed on a part identical or corresponding to each other, and overlapped description is omitted. Moreover, the invention is not limited by the embodiments described below.

Usage of terms herein is as described below.

"Liquid crystal compound" or "liquid crystal compound" is a compound that develops a liquid crystal phase such as a nematic phase and a smectic phase.

Meaning of a phrase such as "arbitrary —$CH_2$— in alkyl may be replaced by —O— or the like" or "arbitrary —$CH_2CH_2$— may be replaced by —CH=CH— or the like" is shown by one example below. Specific examples of a group in which arbitrary —$CH_2$— in $C_4H_9$— is replaced by —O— or —CH=CH— include $C_3H_7O$—, $CH_3$—O—($CH_2)_2$— and $CH_3$—O—$CH_2$—O—. In a similar manner, specific examples of a group in which arbitrary —$CH_2CH_2$— in $C_5H_{11}$— is replaced by —CH=CH— include $H_2C$=CH—$(CH_2)_3$— and $CH_3$—CH=CH—$(CH_2)_2$—, and further, specific examples of a group in which arbitrary —$CH_2$— is replaced by —O— include $CH_3$—CH=CH—$CH_2$—O—. Thus, a term "arbitrary" means "at least one selected without distinction." In addition, in consideration of stability of a compound, $CH_3$—O—$CH_2$—O— in which no oxygen is adjacent to oxygen is preferred to $CH_3$—O—O—$CH_2$— in which oxygen is adjacent to oxygen.

Moreover, with regard to ring A, a phrase "arbitrary hydrogen may be replaced by halogen, alkyl having 1 to 10 carbons or alkyl halide having 1 to 10 carbons" means an aspect of a case where at least one piece of hydrogen in 2, 3, 5 and 6 positions of 1,4-phenylene is replaced by a substituent such as fluorine and a methyl group, for example, and specific examples of an aspect of a case where a substituent is "alkyl halide having 1 to 10 carbons" include a 2-fluoroethyl group and a 3-fluoro-5-chlorohexyl group.

"Compound (1-1)" means a liquid crystal compound represented by formula (1-1) described below, and may occasionally mean at least one kind of compound represented by formula (1-1) described below. "Composition (1) for the heat-dissipation member" means a liquid crystal composition containing at least one kind of compound selected from compounds (1-1) described above. "Polymer (1)" means a liquid crystal polymer obtained by polymerizing composition (1) described above. When one compound (1-1) has a plurality of pieces of A, two pieces of arbitrary A may be identical or different. When a plurality of compounds (1-1) have A, two pieces of arbitrary A may be identical or different. A same rule applies also to any other symbol such as $R^{a1}$ and Z, a group or the like.

Composition for Heat-Dissipation Member

A composition for a heat-dissipation member according to a first embodiment of the invention contains a polymerizable liquid crystal compound having, at both terminals, a structure including an oxiranyl group or an oxetanyl group; a curing agent that cures the polymerizable liquid crystal compound; and an inorganic filler formed by nitride. A curing temperature of the composition for the heat-dissipation member is within or higher than the temperature range in which the liquid crystal compound exhibits a liquid crystal phase, and within or lower than the temperature range in which the liquid crystal compound exhibits an isotropic phase.

A resin phase in which the polymerizable liquid crystal compound is polymerized (cured) in a state in which molecules are aligned in good order can be formed by utilizing the liquid crystal phase of the polymerizable liquid crystal compound. Heat flows through aligned molecules and the inorganic filler arranged along the alignment, and characteristics showing high thermal conduction can be obtained.

Polymerizable Liquid Crystal Compound

Compound (1-1) used in the invention means a liquid crystal compound represented by formula (1-1) described below, has a liquid crystal skeleton and a polymerizable group, and has high polymerization reactivity, a wide temperature range of a liquid crystal phase, good miscibility and the like. Compound (1-1) easily becomes uniform when the compound is mixed with other liquid crystal compounds, other polymerizable compounds or the like.

$$R^{a1}\text{—}Z\text{-}(A\text{-}Z)_{m1}\text{—}R^{a1} \tag{1-1}$$

Physical properties such as a liquid crystal phase development region can be arbitrarily adjusted by appropriately selecting terminal group $R^{a1}$, ring structure A and bonding group Z of compound (1-1). An effect of a kind of terminal group $R^{a1}$, ring structure A and bonding group Z on physical properties of compound (1-1), and preferred examples thereof will be described below.

Terminal Group $R^{a1}$

When $R^{a1}$ of compound (1-1) is straight-chain alkyl, the temperature range of the liquid crystal phase is wide, and viscosity is small. On the other hand, when $R^{a1}$ is branched-chain alkyl, compatibility with other liquid crystal compounds is satisfactory. Also when $R^{a1}$ is cyano, halogen, —$CF_3$ or —$OCF_3$, compound (1-1) shows the good temperature range of the liquid crystal phase, and has high dielectric anisotropy and moderate compatibility.

Specific preferred examples of $R^{a1}$ include hydrogen, fluorine, chlorine, cyano, —N=C=O, —N=C=S, alkyl, alkoxy, alkoxyalkyl, alkoxyalkoxy, alkylthio, alkylthioalkoxy, alkenyl, alkenyloxy, alkenyloxyalkyl, alkoxyalkenyl, alkynyl and alkynyloxy. In the groups, a group in which at least one piece of hydrogen is replaced by halogen is also preferred. Halogen is preferably fluorine and chlorine, and further preferably fluorine. Specific examples thereof include monofluoroalkyl, polyfluoroalkyl, perfluoroalkyl, monofluoroalkoxy, polyfluoroalkoxy and perfluoroalkoxy. In the groups, from a viewpoint of ease of conduction of phonons, more specifically, ease of conduction of heat, a straight chain is preferred to a branched chain.

Specific further preferred examples of $R^{a1}$ include hydrogen, fluorine, chlorine, cyano, —$CF_3$, —$CF_2H$, —$CFH_2$, —$OCF_3$, —$OCF_2H$, alkyl having 1 to 10 carbons, alkoxy having 1 to 10 carbons, and alkoxyalkyl having 2 to 10 carbons. Specific examples of the alkyl, the alkoxy and the alkoxyalkyl include methyl, ethyl, propyl, butyl, pentyl, hexyl, heptyl, octyl, nonyl, decyl, methoxy, ethoxy, propyloxy, butyloxy, pentyloxy, hexyloxy, heptyloxy, octyloxy, nonyloxy, decyloxy, methoxymethyl and methoxyethyl. Specific particularly preferred examples of $R^{a1}$ include alkyl having 1 to 10 carbons and alkoxy having 1 to 10 carbons.

Ring Structure A

When at least one ring in ring structure A of compound (1-1) is 1,4-phenylene, an orientational order parameter and magnetization anisotropy are large. Moreover, when at least two rings are 1,4-phenylene, the temperature range of the liquid crystal phase is wide, and further a clearing point is high. When at least one piece of hydrogen on a 1,4-phenylene ring is replaced by cyano, halogen, —$CF_3$ or —$OCF_3$, dielectric anisotropy is high. Moreover, when at least two rings are 1,4-cyclohexylene, a clearing point is high and viscosity is small.

Specific preferred examples of A include 1,4-cyclohexylene, 1,4-cyclohexenylene, 2,2-difluoro-1,4-cyclohexylene, 1,3-dioxane-2,5-diyl, 1,4-phenylene, 2-fluoro-1,4-phenylene, 2,3-difluoro-1,4-phenylene, 2,5-difluoro-1,4-phenylene, 2,6-difluoro-1,4-phenylene, 2,3,5-trifluoro-1,4-phenylene, pyridine-2,5-diyl, 3-fluoropyridine-2,5-diyl, pyrimidine-2,5-diyl, pyridazine-3,6-diyl, naphthalene-2,6-diyl, tetrahydronaphthalene-2,6-diyl, fluorene-2,7-diyl, 9-methylfluorene-2,7-diyl, 9,9-dimethylfluorene-2,7-diyl, 9-ethylfluorene-2,7-diyl, 9-fluorofluorene-2,7-diyl and 9,9-difluorofluorene-2,7-diyl.

With regard to a configuration of 1,4-cyclohexylene and 1,3-dioxane-2,5-diyl, trans is preferred to cis. Then, 2-fluoro-1,4-phenylene and 3-fluoro-1,4-phenylene are structurally identical, and thus no example of the latter is described. A same rule applies also to a relationship between 2,5-difluoro-1,4-phenylene and 3,6-difluoro-1,4-phenylene, or the like.

Specific further preferred examples of A include 1,4-cyclohexylene, 1,4-cyclohexenylene, 1,3-dioxane-2,5-diyl, 1,4-phenylene, 2-fluoro-1,4-phenylene, 2,3-difluoro-1,4-phenylene, 2,5-difluoro-1,4-phenylene and 2,6-difluoro-1,4-phenylene. Specific particularly preferred examples of A include 1,4-cyclohexylene and 1,4-phenylene.

Bonding Group Z

When bonding group Z of compound (1-1) described above is a single bond, —$(CH_2)_2$—, —$CH_2O$—, —$OCH_2$—, —$CF_2O$—, —$OCF_2$—, —CH=CH—, —CF=CF— or —$(CH_2)_4$—, and particularly when bonding group Z is a single bond, —$(CH_2)_2$—, —$CF_2O$—, —$OCF_2$—, —CH=CH— or —$(CH_2)_4$—, viscosity is reduced. Moreover, when bonding group Z is —CH=CH—, —CH=N—, —N=CH—, —N=N— or —CF=CF—, the temperature range of the liquid crystal phase is wide. Moreover, when bonding group Z is alkyl having about 4 to 10 carbons, a melting point is decreased.

Specific preferred examples of Z include a single bond, —$(CH_2)_2$—, —$(CF_2)_2$—, —COO—, —OCO—, —$CH_2O$—, —$OCH_2$—, —$CF_2O$—, —$OCF_2$—, —CH=CH—, —CF=CF—, —C≡C—, —$(CH_2)_4$—, —(CH$_2$)$_3$O—, —O(CH$_2$)$_3$—, —(CH$_2$)$_2$COO—, —OCO(CH$_2$)$_2$—, —CH=CH—COO— and —OCO—CH=CH—.

Specific further preferred examples of Z include a single bond, —(CH$_2$)$_2$—, —COO—, —OCO—, —CH$_2$O—, —OCH$_2$—, —CF$_2$O—, —OCF$_2$—, —CH=CH— and —C≡C—. Specific particularly preferred examples of Z include a single bond, —(CH$_2$)$_2$—, —COO— or —OCO—.

When compound (1-1) has three or less rings, viscosity is low, and when compound (1-1) has three or more rings, a clearing point is high. In addition, a six-membered ring, a condensed ring including a six-membered ring, and so forth herein are basically regarded as a ring, and for example, a three-membered ring, a four-membered ring or a five-membered ring alone is not regarded as the ring. Moreover, a condensed ring such as a naphthalene ring and a fluorene ring is regarded as one ring.

Compound (1-1) may be optically active or optically inactive. When compound (1-1) is optically active, compound (1-1) has asymmetric carbon or axial asymmetry in several cases. A configuration of the asymmetric carbon may be R or S. The asymmetric carbon may be positioned in any of R$^{a1}$ or A, and when compound (1-1) has the asymmetric carbon, compatibility of compound (1-1) is satisfactory. When compound (1-1) has the axial asymmetry, twist induction force is large. Moreover, any of optical rotation is allowed.

As described above, a compound having objective physical properties can be obtained by appropriately selecting kinds of terminal group R$^{a1}$, ring structure A and bonding group Z, and the number of rings.

Compound (1-1)

Compound (1-1) can also be represented as in formula (1-a) or (1-b) described below.

In formulas (1-a) and (1-b) described above, A, Z, R$^a$ is defined in a manner identical with A, Z and R$^{a1}$ defined by formula (1-1) described above, P represents a polymerizable group represented by formulas (2-1) to (2-2) described above, and Y represents a single bond or alkylene having 1 to 20 carbons, and preferably alkylene having 1 to 10 carbons, and in the alkylene, arbitrary —CH$_2$— may be replaced by —O—, —S—, —CO—, —COO—, —OCO— or —CH=CH—. Particularly preferred Y is alkylene in which —CH$_2$— of one terminal or both terminals of alkylene having 1 to 10 carbons is replaced by —O—. Then, m is an integer from 1 to 6, preferably an integer from 2 to 6, and further preferably an integer from 2 to 4.

Specific preferred examples of compound (1-1) include compounds (a-1) to (g-20) described below.

Formula 2

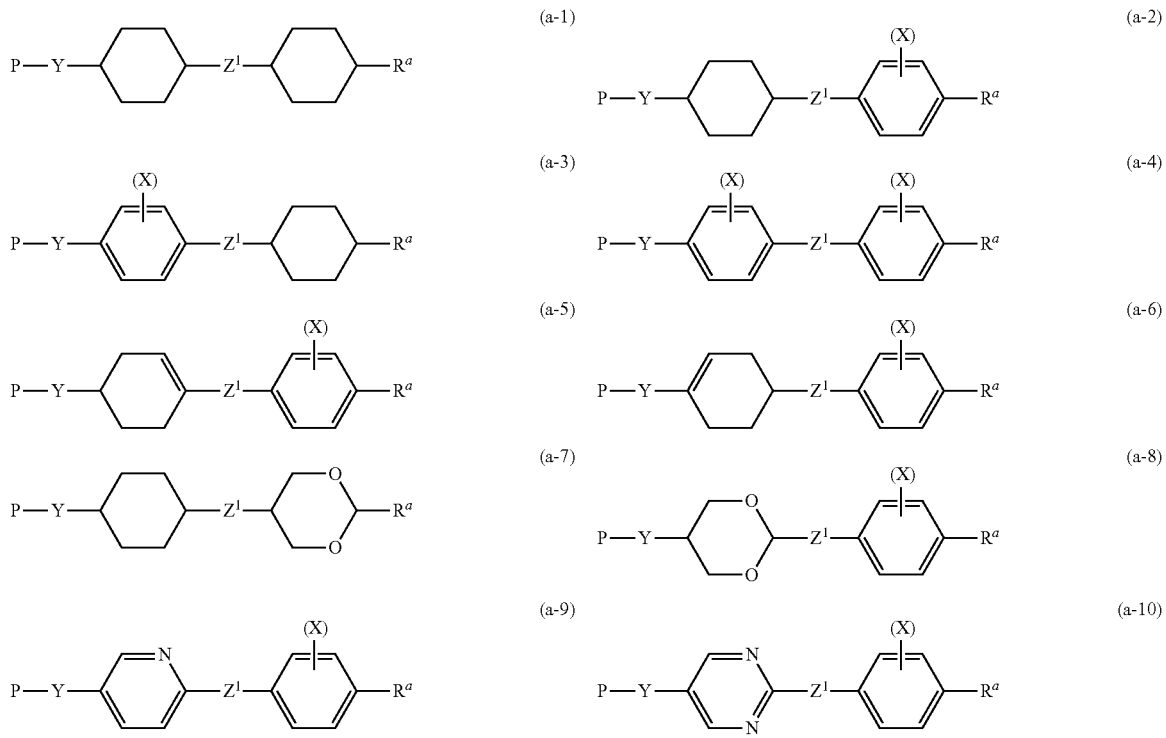

Formula 3

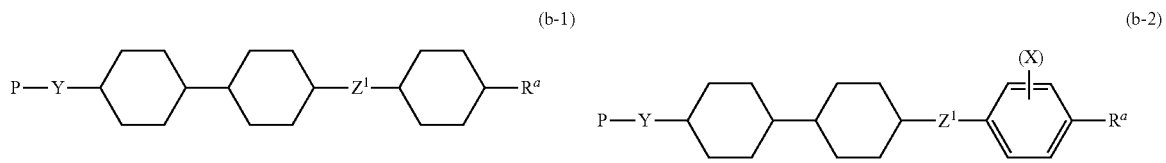

-continued

Formula 4

Formula 5

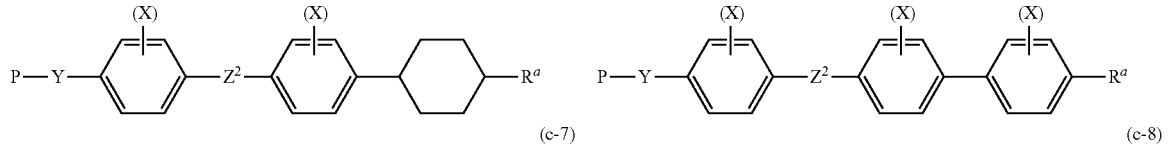
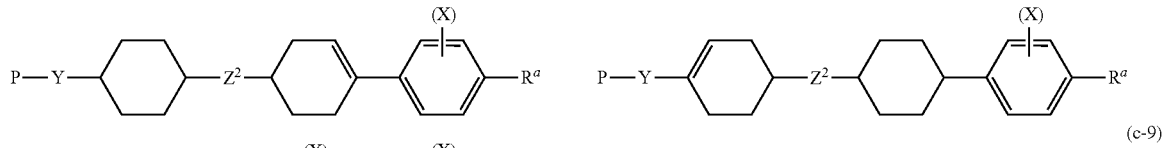
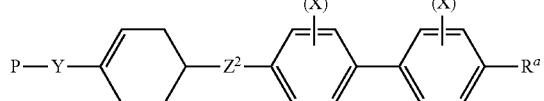
Formula 6
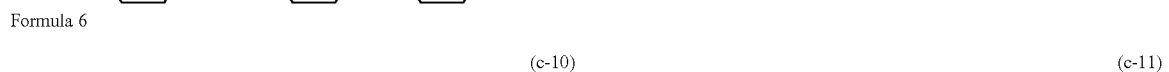
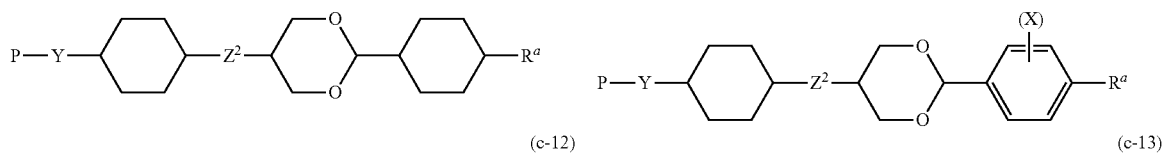
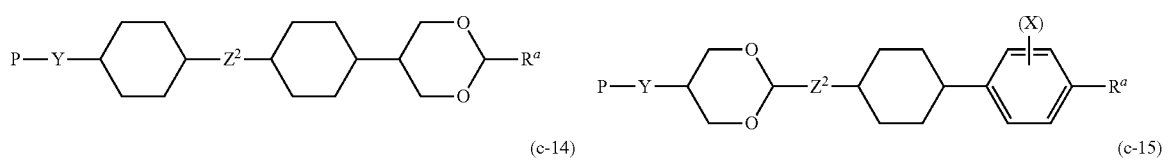
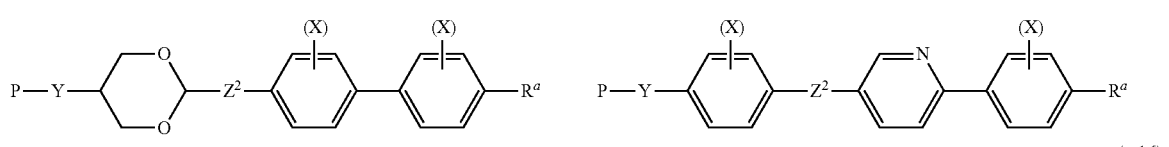
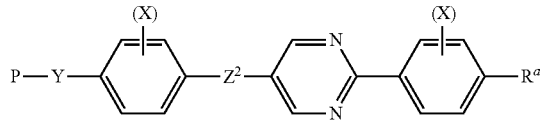
Formula 7
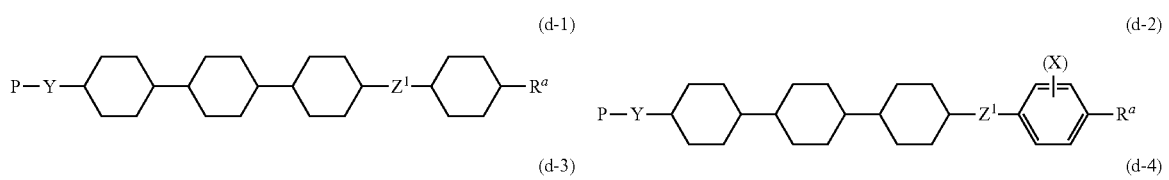
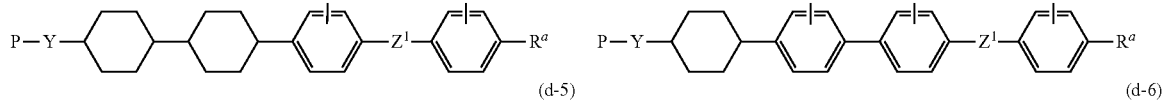
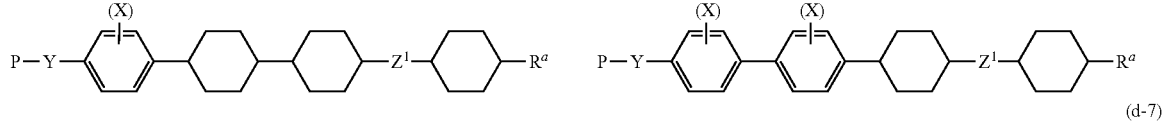
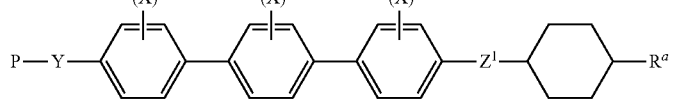

-continued
Formula 8
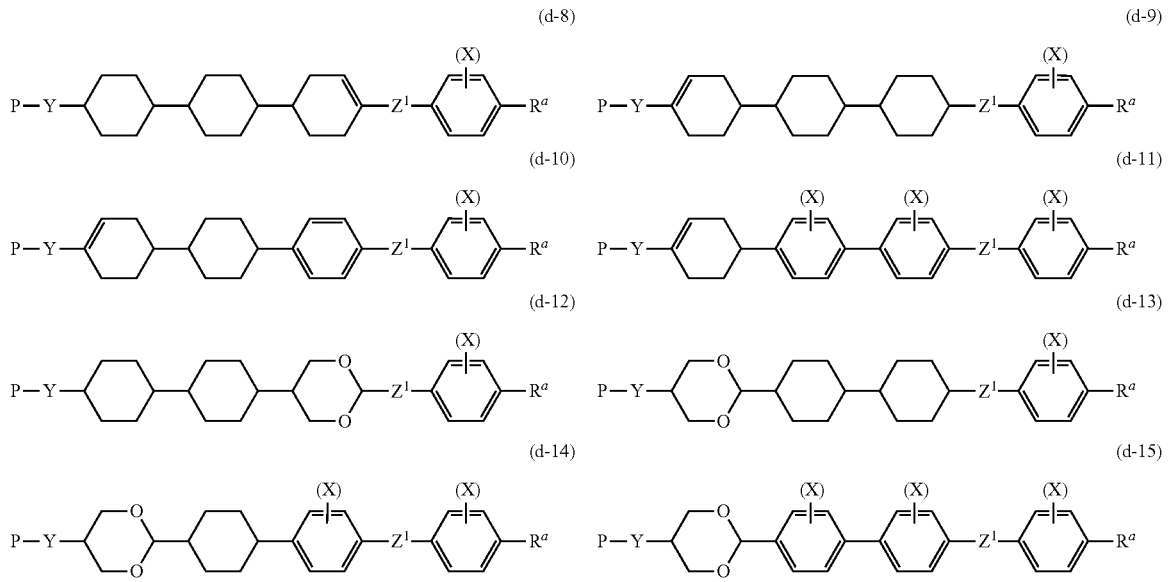
Formula 9
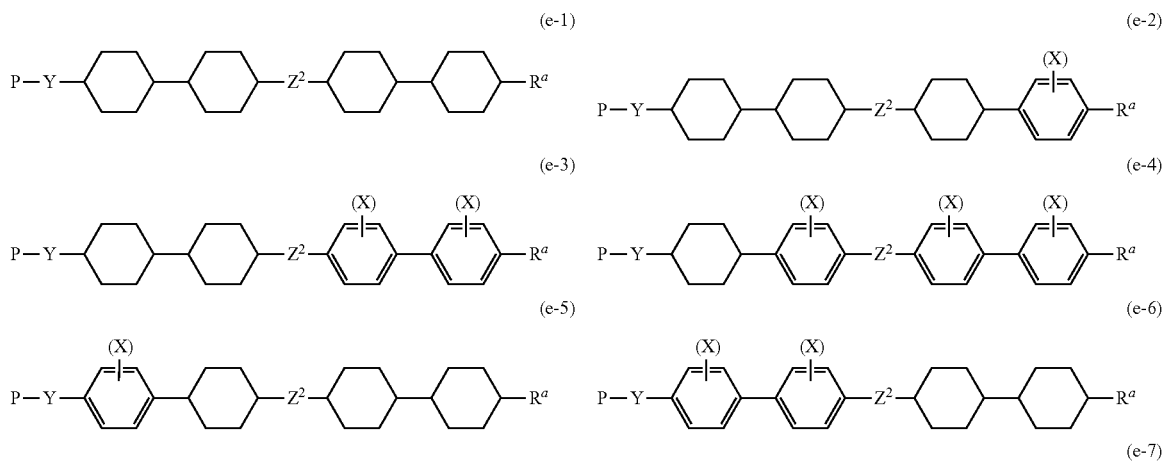
Formula 10
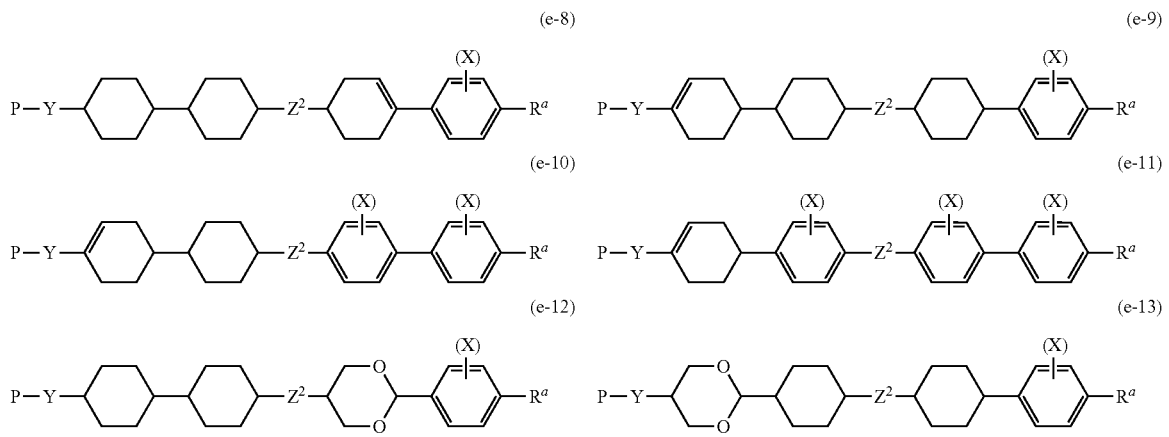

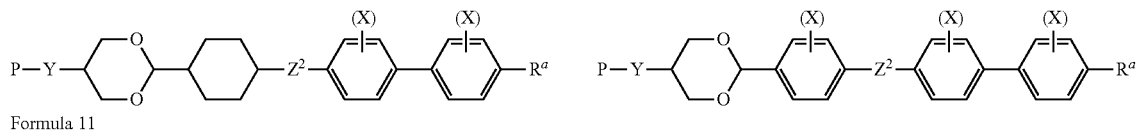
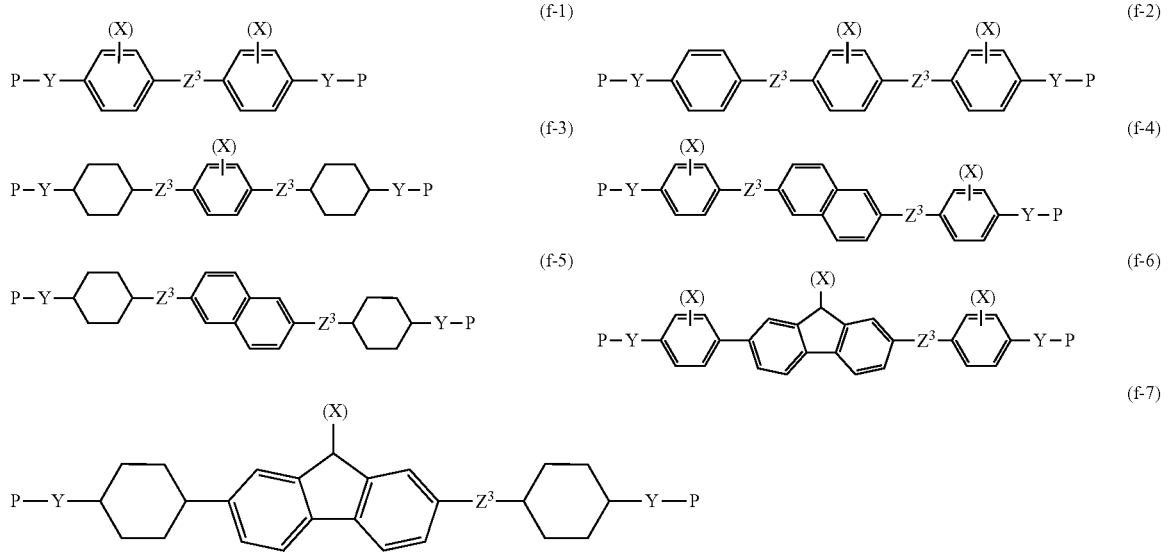
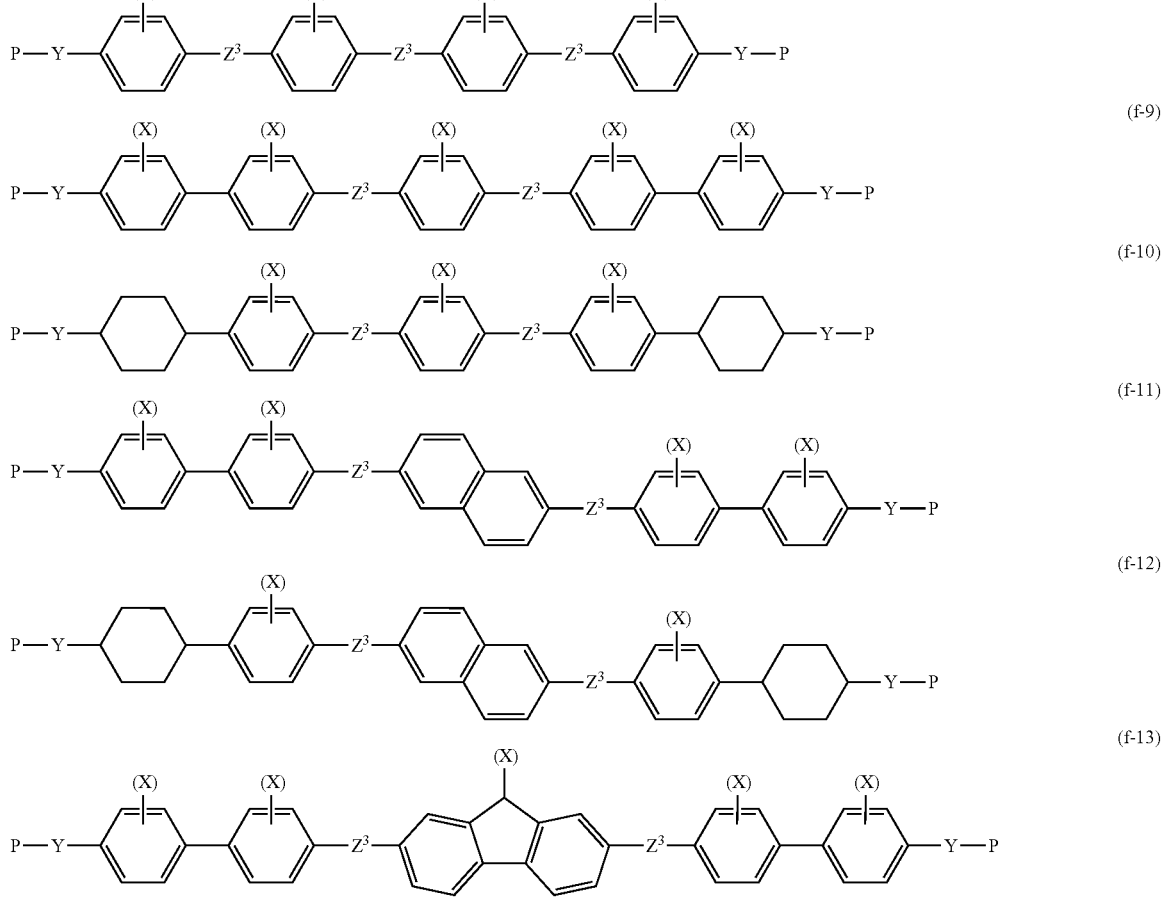

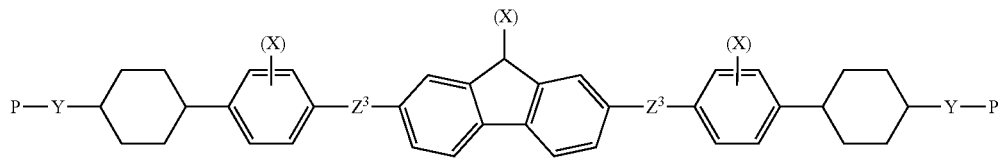
Formula 13
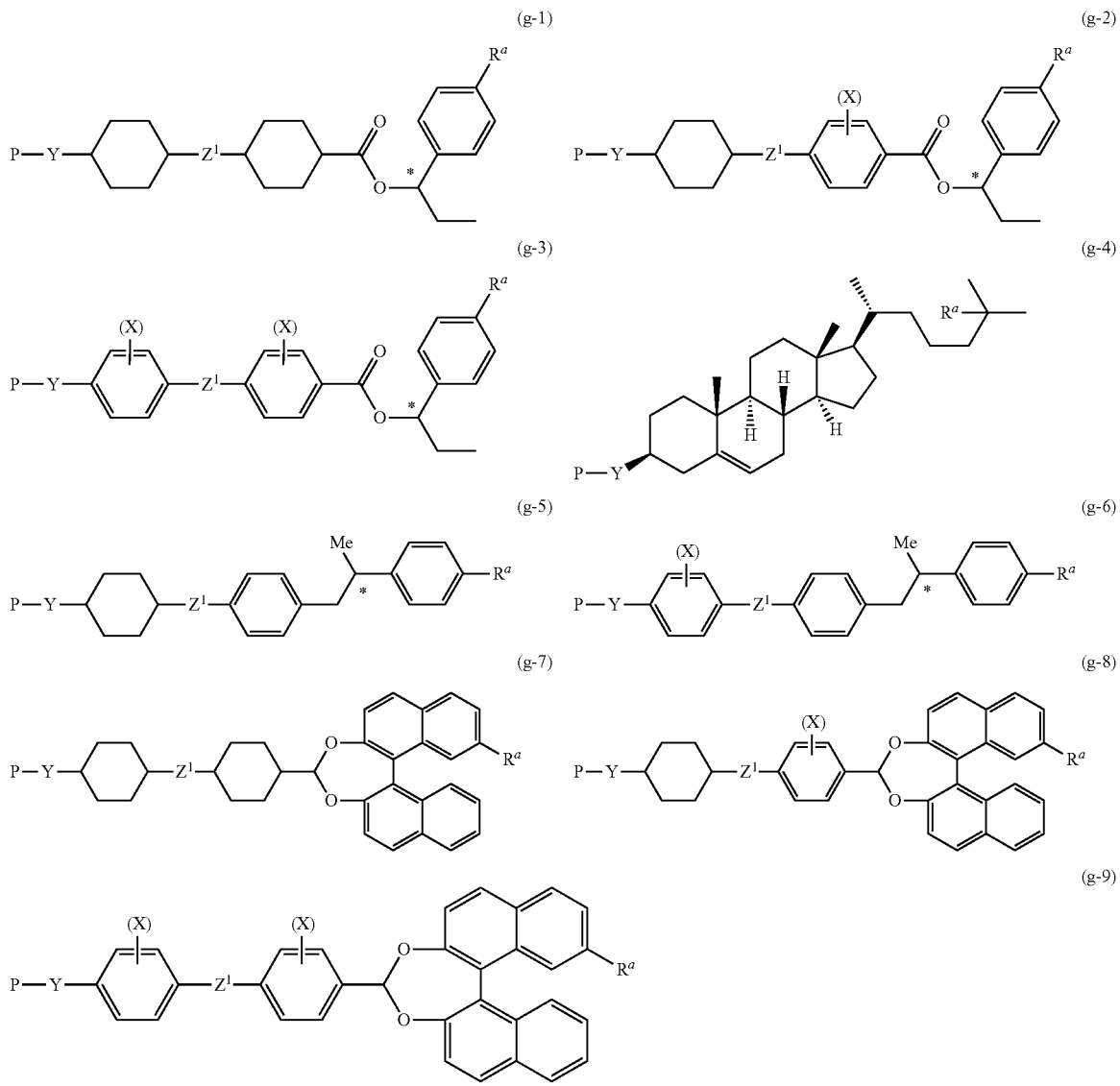
Formula 14
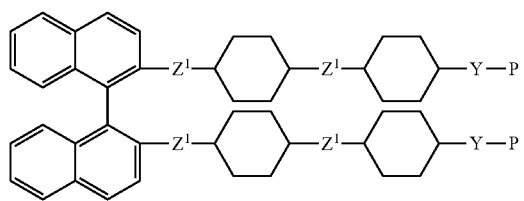
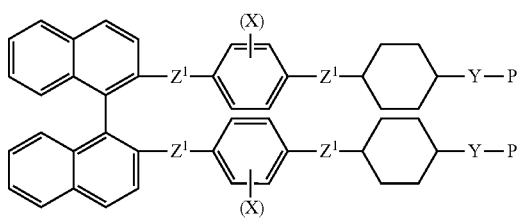

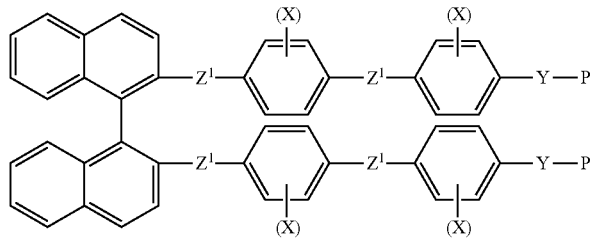

(g-20)

In chemical formulas (a-1) to (g-20) described above, $R^a$, P and Y are as defined in formulas (1-a) and (1-b) described above.

$Z^1$ is a single bond, $-(CH_2)_2-$, $-(CF_2)_2-$, $-(CH_2)_4-$, $-CH_2O-$, $-OCH_2-$, $-(CH_2)_3O-$, $-O(CH_2)_3-$, $-COO-$, $-OCO-$, $-CH=CH-$, $-CF=CF-$, $-CH=CHCOO-$, $-OCOCH=CH-$, $-(CH_2)_2COO-$, $-OCO(CH_2)_2-$, $-C\equiv C-$, $-C\equiv C-COO-$, $-OCO-C\equiv C-$, $-C\equiv C-CH=CH-$, $-CH=CH-C\equiv C-$, $-CH=N-$, $-N=CH-$, $-N=N-$, $-OCF_2-$ or $-CF_2O-$. In addition, a plurality of pieces of $Z^1$ may be identical or different.

$Z^2$ is $-(CH_2)_2-$, $-(CF_2)_2-$, $-(CH_2)_4-$, $-CH_2O-$, $-OCH_2-$, $-(CH_2)_3O-$, $-O(CH_2)_3-$, $-COO-$, $-OCO-$, $-CH=CH-$, $-CF=CF-$, $-CH=CHCOO-$, $-OCOCH=CH-$, $-(CH_2)_2COO-$, $-OCO(CH_2)_2-$, $-C\equiv C-$, $-C\equiv C-COO-$, $-OCO-C\equiv C-$, $-C\equiv C-CH=CH-$, $-CH=CH-C\equiv C-$, $-CH=N-$, $-N=CH-$, $-N=N-$, $-OCF_2-$ or $-CF_2O-$.

$Z^3$ is a single bond, alkyl having 1 to 10 carbons, $-(CH_2)_a-$, $-O(CH_2)_aO-$, $-CH_2O-$, $-OCH_2-$, $-O(CH_2)_3-$, $-(CH_2)_3O-$, $-COO-$, $-OCO-$, $-CH=CH-$, $-CH=CHCOO-$, $-OCOCH=CH-$, $-(CH_2)_2COO-$, $-OCO(CH_2)_2-$, $-CF=CF-$, $-C\equiv C-$, $-CH=N-$, $-N=CH-$, $-N=N-$, $-OCF_2-$ or $-CF_2O-$, and a plurality of pieces $Z^3$ may be identical or different. Then, a is an integer from 1 to 20.

X is 1,4-phenylene in which arbitrary hydrogen may be replaced by halogen, alkyl or alkyl fluoride, and a substituent of fluorene-2,7-diyl, and represents halogen, alkyl or alkyl fluoride.

A further preferred aspect of compound (1-1) will be described. Further preferred compound (1-1) can be represented by formula (1-c) or (1-d) described below.

$$P^1-Y-(A-Z)_m-R^a \quad (1\text{-}c)$$

$$P^1-Y-(A-Z)_m-Y-P^1 \quad (1\text{-}d)$$

In the formulas, A, Y, Z, $R^a$ and m are as defined already, and $P^1$ represents a polymerizable group represented by formulas (2-1) to (2-2) described below. In the case of formula (1-d) described above, two pieces of $P^1$ represent identical polymerizable groups (2-1) to (2-2), two pieces of Y represent an identical group, and two pieces of Y are bonded to be symmetrical.

Formula 15

(2-1)

(2-2)

Specific examples of further preferred compound (1-1) described above are shown below.

| | Y | $-(A-Z)_m-$ |
|---|---|---|
| | | Formula 16 |
| (f-1-1) | single bond, $(CH_2)_2$, $(CH_2)_6$, $(CH_2)_4O$, $(CH_2)_5O$ |  |
| (f-1-2) | single bond, $(CH_2)_3$, $(CH_2)_5$, $(CH_2)_3O$, $(CH_2)_6O$ | |
| (f-1-3) | single bond, $(CH_2)_3$, $(CH_2)_6$, $(CH_2)_3O$, $(CH_2)_6O$ |  |

-continued
| Y | —(A—Z)m— |
|---|---|
| (f-2-1) single bond, $(CH_2)_3$, $(CH_2)_4$, $(CH_2)_3O$, $(CH_2)_6O$ | 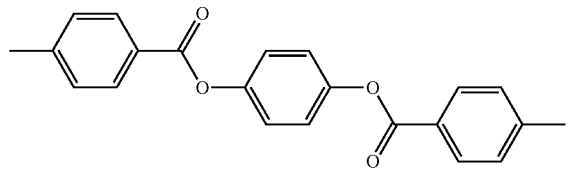 |
| (f-2-2) single bond, $(CH_2)_4$, $(CH_2)_5$, $(CH_2)_4O$, $(CH_2)_6O$ | 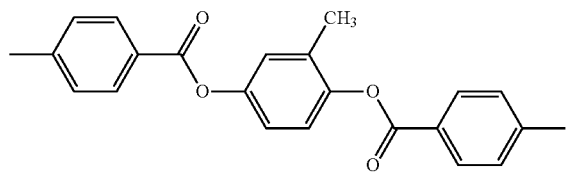 |
| (f-2-3) single bond, $(CH_2)_2$, $(CH_2)_6$, $(CH_2)_3O$, $(CH_2)_6O$ | 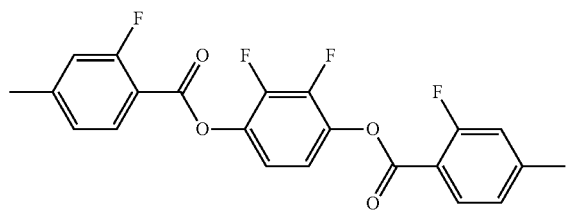 |
| (f-2-4) single bond, $(CH_2)_4$, $(CH_2)_5$, $(CH_2)_4O$, $(CH_2)_6O$ | 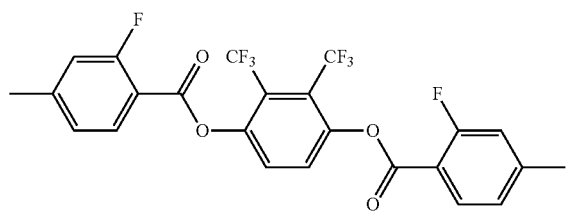 |
| (f-2-5) single bond, $(CH_2)_2$, $(CH_2)_6$, $(CH_2)_4O$, $(CH_2)_5O$ | 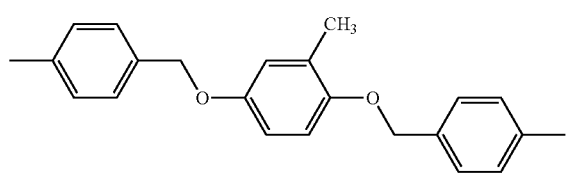 |
| (f-2-5) single bond, $(CH_2)_3$, $(CH_2)_6$, $(CH_2)_3O$, $(CH_2)_5O$ | 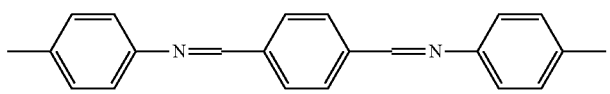 |
| (f-3-1) single bond, $(CH_2)_3$, $(CH_2)_4$, $(CH_2)_3O$, $(CH_2)_6O$ | 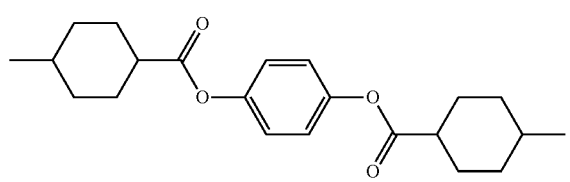 |
| (f-3-2) single bond, $(CH_2)_4$, $(CH_2)_5$, $(CH_2)_4O$, $(CH_2)_5O$ | 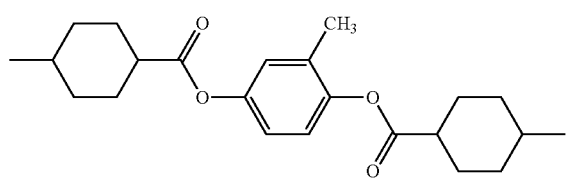 |

-continued

| | Y | —(A—Z)m— |
|---|---|---|
| (f-4-1) | single bond, $(CH_2)_2$, $(CH_2)_4$, $(CH_2)_6O$, $(CH_2)_7O$ | ![structure] |
| (f-5-2) | single bond, $(CH_2)_3$, $(CH_2)_6$, $(CH_2)_4O$, $(CH_2)_6O$ | ![structure] |

Formula 17

| | Y | —(A—Z)m— |
|---|---|---|
| (f-6-1) | single bond, $(CH_2)_3$, $(CH_2)_7$, $(CH_2)_3O$, $(CH_2)_6O$ | ![structure] |
| (f-6-2) | single bond, $(CH_2)_3$, $(CH_2)_5$, $(CH_2)_4O$, $(CH_2)_6O$ | ![structure] |
| (f-6-3) | single bond, $(CH_2)_4$, $(CH_2)_5$, $(CH_2)_3O$, $(CH_2)_6O$ | ![structure] |
| (f-6-4) | single bond, $(CH_2)_3$, $(CH_2)_6$, $(CH_2)_4O$, $(CH_2)_5O$ | ![structure] |
| (f-6-5) | single bond, $(CH_2)_4$, $(CH_2)_6$, $(CH_2)_3O$, $(CH_2)_4O$ | ![structure] |
| (f-7-1) | single bond, $(CH_2)_4$, $(CH_2)_5$, $(CH_2)_3O$, $(CH_2)_6O$ | ![structure] |

-continued

| Y | —(A—Z)m— |
|---|---|
| (f-7-2) | single bond, $(CH_2)_3$, $(CH_2)_7$, $(CH_2)_3O$, $(CH_2)_5O$ |
| (f-8-1) | single bond, $(CH_2)_3$, $(CH_2)_5$, $(CH_2)_3O$, $(CH_2)_6O$ |
| (f-8-2) | single bond, $(CH_2)_5$, $(CH_2)_7$, $(CH_2)_2O$, $(CH_2)_5O$ |
| (f-8-2) | single bond, $(CH_2)_3$, $(CH_2)_4$, $CH_3O$, $(CH_2)_4O$ |
| (f-9-1) | single bond, $(CH_2)_2$, $(CH_2)_4$, $(CH_2)_4O$, $(CH_2)_5O$ |
| (f-10-1) | single bond, $(CH_2)_3$, $(CH_2)_6$, $(CH_2)_3O$, $(CH_2)_6O$ |

Formula 18

| (f-11-1) | single bond, $(CH_2)_4$, $(CH_2)_5$, $(CH_2)_3O$, $(CH_2)_6O$ |
| (f-12-1) | single bond, $(CH_2)_3$, $(CH_2)_5$, $(CH_2)_4O$, $(CH_2)_6O$ |

-continued

| Y | —(A—Z)m— |
|---|---|
| (f-13-1) single bond, $(CH_2)_3$, $(CH_2)_7$, $(CH_2)_3O$, $(CH_2)_5O$ | |
| (f-13-2) single bond, $(CH_2)_4$, $(CH_2)_6$, $(CH_2)_3O$, $(CH_2)_4O$ | |
| (f-13-3) single bond, $(CH_2)_3$, $(CH_2)_5$, $(CH_2)_4O$, $(CH_2)_5O$ | |
| (f-14-1) single bond, $(CH_2)_3$, $(CH_2)_5$, $(CH_2)_3O$, $(CH_2)_6O$ | |
| (f-14-2) single bond, $(CH_2)_3$, $(CH_2)_6$, $(CH_2)_3O$, $(CH_2)_6O$ | |

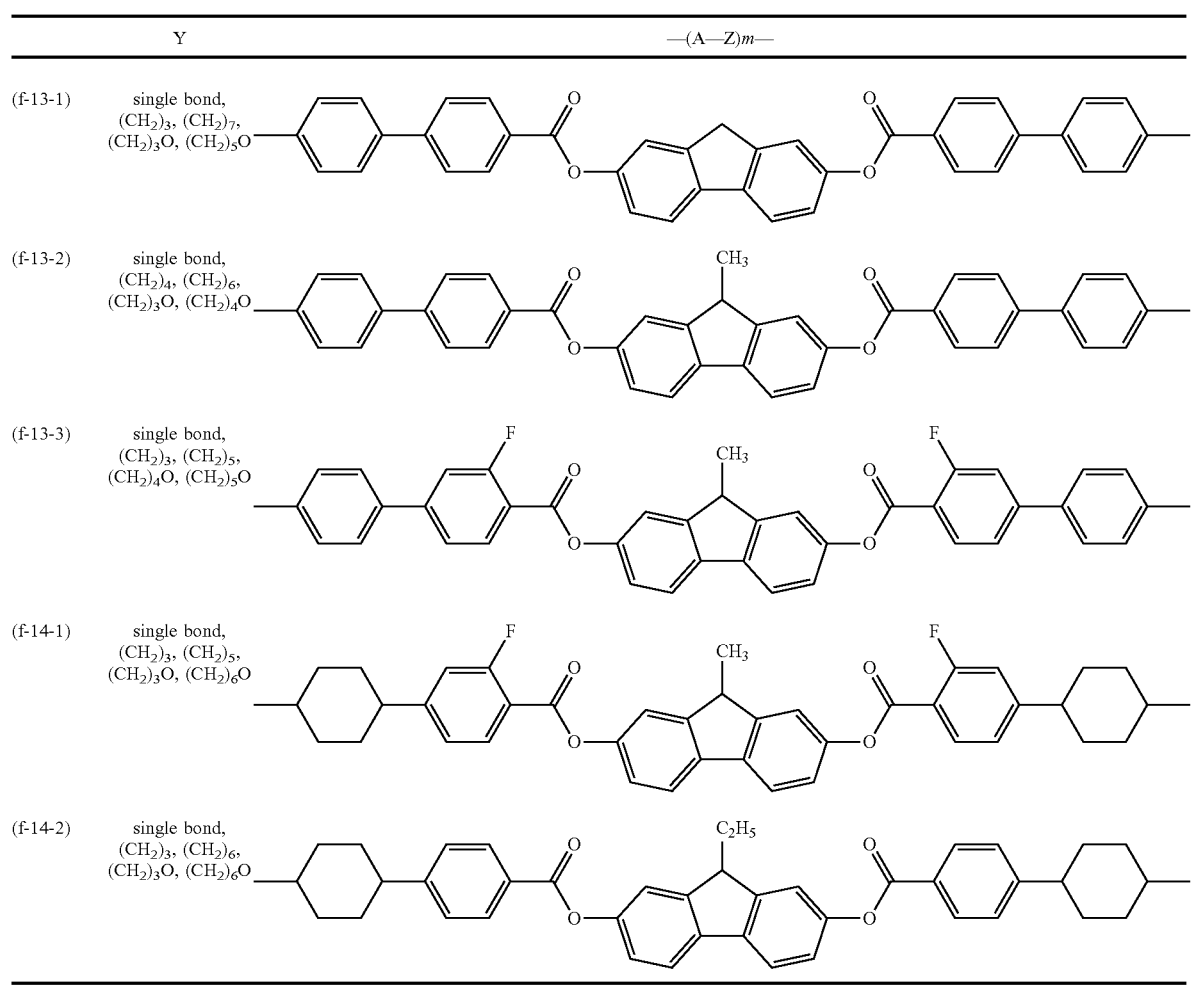

Synthesis Method of Compound (1-1)

Compound (1-1) described above can be prepared by combining publicly-known methods in synthetic organic chemistry. Methods for introducing an objective terminal group, ring structure and bonding group into a starting material are described in books such as Houben-Weyl (Methods of Organic Chemistry, Georg Thieme Verlag, Stuttgart), Organic Syntheses (John Wiley & Sons, Inc.), Organic Reactions (John Wiley & Sons Inc.), Comprehensive Organic Synthesis (Pergamon Press) and New Experimental Chemistry Course (Shin Jikken Kagaku Koza in Japanese) (Maruzen Co., Ltd.). Moreover, JP 2006-265527 A may be seen.

Curing Agent

Examples of a preferred curing agent are shown below.

Specific examples of an amine curing agent include diethylenetriamine, triethylenetetramine, tetraethylenepentamine, o-xylenediamine, m-xylenediamine, p-xylenediamine, trimethylhexamethylenediamine, 2-methylpentamethylenediamine, diethylaminopropylamine, isophoronediamine, 1,3-bisaminomethylcyclohexane, bis(4-amino-3-methylcyclohexyl)methane, bis(4-aminocyclohexyl)methane, norbornenediamine, 1,2-diaminocyclohexane, 3,9-dipropanamine-2,4,8,10-tetraoxaspiro[5,5]undecane, 4,4'-diaminodiphenylmethane, 4,4'-diamino-1,2-diphenylethane, o-phenylenediamine, m-phenylenediamine, p-phenylenediamine, 4,4'-diaminodiphenylsulfone, polyoxypropylenediamine, polyoxypropylenetriamine, polycyclohexylpolyamine and N-aminoethylpiperazine.

In particular, diamine can cause cure of the polymerizable liquid crystal compound without adversely affecting liquid crystallinity of the polymerizable liquid crystal compound, and therefore such a case is preferred. An amount of the curing agent only needs to be appropriately selected depending on an epoxy equivalent or an oxetane equivalent.

Inorganic Filler as Filler

Specific examples of the filler (inorganic filler) having high thermal conductivity include nitride such as aluminum nitride, boron nitride and silicon nitride. Specific examples of the filler may include an inorganic filler and a metallic filler such as diamond, plumbago, silicon carbide, silicon, beryllia, magnesium oxide, aluminum oxide, zinc oxide, silicon oxide, copper oxide, titanium oxide, cerium oxide, yttrium oxide, tin oxide, holmium oxide, bismuth oxide, cobalt oxide, calcium oxide, aluminum nitride, boron nitride, silicon nitride, magnesium hydroxide, aluminium hydroxide, gold, silver, copper, platinum, iron, tin, lead, nickel, aluminum, magnesium, tungsten, molybdenum and stainless steel. Specific examples of a shape of the filler include a spherical, amorphous, fibrous, rod-like, cylinder-like or plate-like shape. As the shape of the filler, a shape without adversely affecting alignment when polymerizable liquid crystal compound develops the liquid crystal phase is preferred. A kind, the shape, a size, an amount of addition or the like of the filler can be appropriately selected according to a purpose. When the heat-dissipation member obtained needs insulation, as long as desired insulation is kept, the filler having conductivity is allowed.

The filler is preferably boron nitride or aluminum nitride. Hexagonal boron nitride (h-BN) or hexagonal aluminum nitride is particularly preferred. Boron nitride or aluminum nitride is significantly high in thermal conductivity in a plane direction, also low in a dielectric constant, and high in insulation, and therefore such a case is preferred.

For example, if plate-like crystal boron nitride is used, plate-like structure is easily arranged along alignment of the liquid crystal compounds, or the liquid crystal compounds are easily aligned along the plate-like structure, and therefore such a case is preferred.

A mean particle diameter of the filler is preferably 0.1 to 200 micrometers, and further preferably 1 to 100 micrometers. If the diameter is 0.1 micrometer or more, thermal conductivity is satisfactory, and if the diameter is 200 micrometers or less, a filling rate can be increased.

In addition, the mean particle diameter herein means a diameter based on particle size distribution measurement according to a laser diffraction and scattering method. More specifically, when powder is divided into two bordering on a predetermined particle size by a wet method utilizing analysis by Fraunhofer diffraction theory and Mie scattering theory, a diameter at which an amount on a large side and an amount on a small side become equivalent (volume base) is taken as a median diameter.

An amount of the filler is preferably adjusted in such a manner that the heat-dissipation member after being cured preferably contains therein 20 to 95% by weight of the filler, and is further preferably 50 to 95% by weight. Then, if the amount is 20% by weight, thermal conductivity becomes high, and such a case is preferred. If the amount is 95% by weight or less, no heat-dissipation member becomes brittle, and such a case is preferred.

Figure 2:
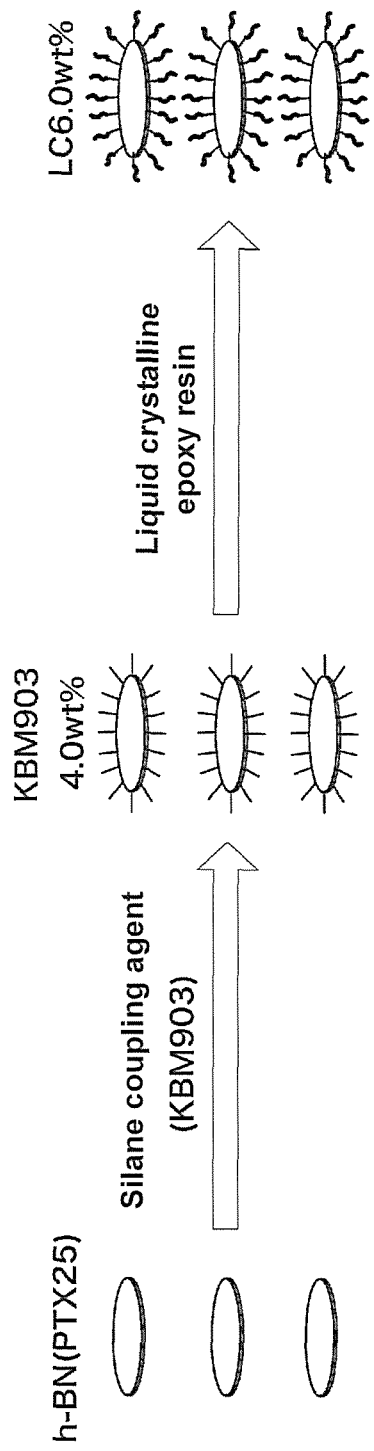
FIG. 2 is illustrative views of inorganic fillers contained in a composition for a heat-dissipation member according to the invention, and an unmodified filler (left), a filler treated with a coupling agent (center), or a filler subjected to coupling treatment and then surface modification with a polymerizable liquid crystal compound (right).

As the filler, an unmodified material (left in FIG. 2) may be directly used. Alternatively, a material (center in FIG. 2) a surface of which is treated with a coupling agent may be used. For example, as shown in FIG. 2, boron nitride (h-BN) is treated with a silane coupling agent. In the case of boron nitride, no reaction group exists on surfaces of particles, and therefore the silane coupling agent is bonded only on a periphery thereof. The boron nitride treated with the coupling agent can form bonding with the polymerizable liquid crystal compound in the composition for the heat-dissipation member, and the bonding is considered to contribute to thermal conduction.

The coupling agent preferably reacts with an oxiranyl group or the like, or the curing agent, and therefore preferably a material having an amine-base, the oxiranyl group or the like at a terminal. Specific examples thereof include Sila-Ace S310, S320, S330, S360, S510 and S530 made by JNC Corporation. In addition, with regard to modification with the coupling agent, as a larger amount of modification is made, the number of bondings increases, and therefore such a case is preferred.

As the filler, a material (right in FIG. 2) subjected to treatment with the coupling agent and then surface modification with a polymerizable liquid crystal compound may be used. For example, as shown in FIG. 2, boron nitride (h-BN) treated with the silane coupling agent is subjected to surface modification with the polymerizable liquid crystal compound. The boron nitride subjected to surface modification with the polymerizable liquid crystal compound can form bonding with the polymerizable liquid crystal compound in the composition for the heat-dissipation member, and the bonding is considered to contribute to thermal conduction.

A polymerizable liquid crystal compound is preferably a compound represented by formula (1-1) described above, but may be the other polymerizable liquid crystal compound, and a polymerizable compound without liquid crystallinity may be used. Surface modification with the polymerizable liquid crystal compound or the like is preferred because the more modification increases more bonding.

Any Other Constituent

Composition (1) for the heat-dissipation member of the present application is a material containing at least one kind of compound (1-1) described above, and being complexed with an inorganic filler as a highly thermal conductive inorganic filler. Composition (1) may be formed of two or more kinds of compound (1-1), and a combination of at least one kind of compound (1-1) and at least one kind of compound other than compound (1-1). A constituent other than such compound (1-1) is not particularly limited, and specific examples include a polymerizable compound (hereinafter, also referred to as "any other polymerizable compound") other than compound (1-1), a non-polymerizable liquid crystal compound, a polymerization initiator and a solvent.

Any Other Polymerizable Compound

Composition (1) for the heat-dissipation member may have, as the constituent, any other polymerizable compound. Such a polymerizable compound is preferably a compound that causes no reduction of film formability and mechanical strength. The polymerizable compound is classified into a compound having no liquid crystallinity and a compound having liquid crystallinity. Specific examples of the polymerizable compound having no liquid crystallinity include a vinyl derivative, a styrene derivative, a (meth)acrylic acid derivative, a sorbic acid derivative, a fumaric acid derivative and an itaconic acid derivative.

Non-Polymerizable Liquid Crystal Compound

Composition (1) for the heat-dissipation member may have, as the constituent, a liquid crystal compound having no polymerizable group. Examples of such a non-polymerizable liquid crystal compound are described in LiqCryst (LCI Publisher GmbH, Hamburg, Germany) being database of liquid crystal compounds, or the like. A composite material between a polymer of compound (1-1) and a liquid crystal compound can be obtained by polymerizing composition (1) containing the non-polymerizable liquid crystal compound. In such a composite material, the non-polymerizable liquid crystal compound exists in a polymer network as in a polymer dispersed liquid crystal, for example.

Polymerization Initiator

Composition (1) for the heat-dissipation member may have, as the constituent, a polymerization initiator. As the polymerization initiator, for example, a photoradical polymerization initiator, a photocationic polymerization initiator, or a thermal radical polymerization initiator only needs to be used according to a method of polymerizing composition (1).

Specific examples of a preferred initiator for thermal radical polymerization include benzoyl peroxide, diisopropyl peroxydicarbonate, t-butylperoxy-2-ethylhexanoate, t-butyl peroxypivalate, di-t-butyl peroxide (DTBPO), t-butyl peroxydiisobutyrate, lauroyl peroxide, dimethyl 2,2'-azobis (2-methylpropionate) (MAIB), azobisisobutyronitrile (AIBN) and azobiscyclohexanecarbonitrile (ACN).

Solvent

Composition (1) for the heat-dissipation member may contain a solvent. Polymerization of composition (1) may be performed in the solvent or without the solvent. Composition (1) containing the solvent is applied onto a substrate by a spin coating method, for example, and then may be subjected to photopolymerization after removal of the solvent. Moreover, after photo-cure, the resulting material may be heated to a suitable temperature, and then post-treatment may be applied thereto.

Specific preferred examples of the solvent include benzene, toluene, xylene, mesitylene, hexane, heptane, octane, nonane, decane, tetrahydrofuran, γ-butyrolactone, N-methylpyrrolidone, dimethylformamide, dimethylsulfoxide, cyclohexane, methylcyclohexane, cyclopentanone, cyclohexanone and PGMEA. The solvents may be used alone, or in combination of two or more kinds.

In addition, limitation of a use ratio of the solvents during polymerization has little meaning, and the use ratio only needs to be individually determined for each case in consideration of polymerization efficiency, solvent cost, energy cost or the like.

Others

Compound (1-1) and composition (1) for the heat-dissipation member as described above have high polymerizability, and therefore in order to facilitating handling, a stabilizer may be added thereto. As such a stabilizer, a publicly-known stabilizer can be used without restriction, and specific examples of the stabilizer include hydroquinone, 4-ethoxyphenol and 3,5-di-t-butyl-4-hydroxytoluene (BHT).

Further, an additive (oxide or the like) may be added thereto for adjusting viscosity and color of the composition for the heat-dissipation member. Specific examples include titanium oxide for applying white, carbon black for applying black and a silica fine powder for adjusting viscosity. Moreover, the additive may be added for further increasing mechanical strength. Specific examples of inorganic fibers and cloth such as glass and carbon fibers or macromolecular additives include a fiber or a long molecule such as polyvinylformal, polyvinylbutyral, polyester, polyamide and polyimide.

Heat-Dissipation Member

A heat-dissipation member according to a second embodiment of the invention is a product prepared by molding, according to an application, a cured material (polymer (1)) obtained by curing the composition for the heat-dissipation member according to the first embodiment.

Polymer (1) is obtained by alignment controlling and polymerization polymerizing composition (1) for the heat-dissipation member, composition (1) containing at least one kind of compound (1). Polymer (1) has high thermal conductivity, and is low in water permeability, water absorption and a gas transmission rate, and excellent in chemical stability, heat resistance, hardness, mechanical strength and so forth. In addition, the mechanical strength means Young's modulus, tensile strength, tearing strength, flexural strength, flexural modulus and impact strength.

FIG. 1 is an illustrative view of a heat-dissipation member in the case where boron nitride is used as a filler, wherein 1 represents the polymerizable liquid crystal compound, and 2 represents the inorganic filler (boron nitride).

Polymer (1) is a thermosetting resin. If compound (1-1) in which both terminals are polymerizable groups is used, the thermosetting resin can be easily obtained.

The thermosetting resin has three-dimensional cross-linked structure. Such polymer (1) becomes insoluble in a solvent, and therefore a molecular weight cannot be measured. However, when the heat-dissipation member is obtained by applying composition (1) for the heat-dissipation member onto a substrate, immobilizing alignment of molecules and polymerizing the polymerizable compound, no further processing is applied thereto, and therefore magnitude of the molecular weight causes no problem, and conditions only need to be satisfied in a use environment. Moreover, in order to increase the molecular weight, a crosslinking agent may be added thereto. Thus, polymer (1) that is significantly excellent in chemical resistance and heat resistance can be obtained. As such a crosslinking agent, a publicly-known crosslinking agent can be used without restriction, and specific examples thereof include tris(3-mercaptopropionate).

As mentioned above, polymer (1) can have features in which molecular alignment is immobilized in an arbitrary direction. Thus, polymer (1) having high thermal conductivity provided in a predetermined direction can be obtained by aligning mesogen moieties of liquid crystal molecules in the predetermined direction and immobilized as uniformly as possible. The direction can be arbitrarily controlled by aligning the liquid crystal molecules before polymerization.

In addition, high thermal conduction in all directions can be achieved by laminating, in each direction, a film aligned in a predetermined direction. Such laminated structure can also be formed by repeating processes "application of the composition for the heat-dissipation member, to polymerization, to application of the composition for the heat-dissipation member, and to polymerization." Formation of the laminated structure in such a manner is also useful in relaxing anisotropy of mechanical strength of the heat-dissipation member to be obtained. Moreover, achievement of thermal conduction of the film in a thickness direction may be improved by cutting off the film aligned in a predetermined direction, and rearranging the film to be longitudinal in alignment.

Specific examples of a method for performing alignment control of mesogen moieties of liquid crystal molecules in composition (1) for the heat-dissipation member include a method in which an alignment film is used, a method in which an alignment control agent is added to composition (1), a rubbing treatment method and a method in which the moieties are aligned by self-alignment regulating force of composition (1) itself. The methods may be applied alone, or in combination of two or more kinds. Specific examples of alignment states to be controlled according to such an alignment control method include homogeneous alignment, twist alignment, homeotropic alignment, hybrid alignment, bend alignment and splay alignment, and the states can be appropriately determined according to an application or the alignment control method.

Specific examples of a method for controlling alignment by self-alignment force of composition (1) for the heat-dissipation member itself include a method in which heat treatment is applied to composition (1). Heat treatment of composition (1) is applied at or higher than a clearing point of composition (1). One example of the method of heat treatment includes a method in which composition (1) is heated to temperature at which composition (1) exhibits a liquid crystal phase to form alignment in composition (1). Moreover, alignment may be formed by changing temperature within the temperature range in which composition (1) exhibits the liquid crystal phase. In the method, alignment of composition (1) is substantially completed by heating composition (1) to a high temperature region in the temperature range in which the composition exhibits the liquid crystal phase, and next further orderly alignment is achieved by decreasing the temperature. In addition, the liquid crystal phase developed by composition (1) for the heat-dissipation member may be any of the nematic phase, the smectic phase and the cholesteric phase.

Temperature of the heat treatment is in the range of room temperature to 150° C., preferably room temperature to 100° C., and further preferably room temperature to 70° C. A period of time of the heat treatment is in the range of 5 seconds to 2 hours, preferably 10 seconds to 60 minutes, and further preferably 20 seconds to 30 minutes. If the period of time of the heat treatment is shorter than the range described above, temperature of a layer formed of composition (1) for the heat-dissipation member cannot be increased up to predetermined temperature in several cases, and if the period of time is longer than the range described above, productivity is reduced in several cases. In addition, conditions of the heat treatment are changed depending on a kind and a composition ratio of compounds used in composition (1), presence or absence, a content of the polymerization initiator, or the like, and therefore approximate ranges are only shown.

Specific examples of a method of polymerizing composition (1) for the a-dissipation member include radical polymerization, anionic polymerization, cationic polymerization and coordination polymerization, but in order to immobilize molecular arrangement or helical structure, thermal polymerization or photopolymerization utilizing a light ray and heat of an electron beam, ultraviolet light, visible light or infrared light (heat ray) is suitable. Thermal polymerization is preferably performed in the presence of the radical polymerization initiator, and photopolymerization is preferably performed in the presence of the photoradical polymerization initiator. Moreover, thermal polymerization by heat is preferred depending on a content of the filler. Polymer (1) obtained may be any of a homopolymer, a random copolymer, an alternating copolymer, a block copolymer and a graft copolymer, and only needs to be appropriately selected according to an application or the like.

As conditions for immobilizing alignment of composition (1) for the heat-dissipation member by thermal polymerization, a heat-curing temperature is in the range of room temperature to 350° C., preferably room temperature to 250° C., and further preferably 50° C. to 200° C., and a curing period of time is in the range of 5 seconds to 10 hours, preferably 1 minute to 5 hours, and further preferably 5 minutes to 1 hour. After polymerization, the resulting material is preferably slowly cooled in order to suppress stress and strain or the like. Moreover, re-heat treatment may be applied thereto to relax strain or the like.

As described above, a polymer subjected to alignment control or a polymer in a process of polymerization may be further subjected to alignment control in an arbitrary direction by mechanical operation such as stretching.

Isolated polymer (1) may be dissolved in a solvent, aligned on an alignment-treated substrate, and processed into a film or the like, two polymers may be mixed and processed, and a plurality of polymers may be laminated. Specific examples of the solvent preferably include N-methyl-2-pyrrolidone, dimethylsulfoxide, N,N-dimethylacetamide, N,N-dimethylformamide, N,N-dimethylacetamide dimethyl acetal, tetrahydrofuran, chloroform, 1,4-dioxane, bis(methoxyethyl) ether, γ-butyrolactone, tetramethylurea, trifluoroacetic acid, ethyl trifluoroacetate, hexafluoro-2-propanol, 2-methoxyethyl acetate, methyl ethyl ketone, cyclopentanone and cyclohexanone. The solvents may be mixed with a general organic solvent such as acetone, benzene, toluene, heptane and methylene chloride, and then used.

The heat-dissipation member of the present application is formed of polymer (1) described above, and used in a shape of a sheet, a film, a thin film, fibers, a molded body or the like. A preferred shape is a film and a thin film. The materials are preferably cured in a state in which alignment treatment utilizing fluidity is applied thereto and the materials are aligned. The film and the thin film are obtained by polymerizing composition (1) for the heat-dissipation member in a state in which composition (1) is applied onto a substrate or in which composition (1) is interposed with the substrates. Moreover, the film and the thin film are also obtained by applying composition (1) containing a solvent onto a substrate subjected to alignment treatment and removing the solvent. Further, the film can also be obtained by press molding of the polymer. In addition, a thickness of the sheet herein is 1 mm or more, a thickness of the film is 5 micrometers or more, preferably 10 to 500 micrometers, and further preferably 20 to 300 micrometers, and a thickness of the thin film is less than 5 micrometers. The thickness only needs to be appropriately changed according to an application.

Production Method

Hereinafter, composition (1) for a heat-dissipation member and a method for producing the heat-dissipation member will be specifically described.

When Coupling Treatment is Applied Thereto

When a filler treated with a coupling agent is used, coupling treatment is applied to the filler. A publicly-known method can be applied to the coupling treatment.

As one example, first, filler particles and a coupling agent are added to a solvent. The resulting mixture is stirred using a stirrer or the like, and allowed to stand. The solvent is dried, and then heat treatment is applied thereto by using a vacuum dryer or the like under vacuum conditions. A solvent is added to the filler particles, and the resulting mixture is pulverized by supersonic treatment. The resulting solution is separated and purified using a centrifuge. A supernatant is disposed of, and then a solvent is added thereto, and similar operation is performed several times. The resulting filler particles after being purified are dried using an oven.

Next, the filler particles subjected to coupling treatment and a polymerizable liquid crystal compound are mixed using an agate mortar or the like, and then the resulting mixture is kneaded using a twin-screw roll or the like. Then, the resulting mixture is separated and purified by supersonic treatment and centrifugation.

Further, the resulting mixture is mixed using an amine curing agent, and an agate mortar or the like, and then the resulting mixture is kneaded using a twin-screw roll or the like. Thus, composition (1) for the heat-dissipation member, composition (1) containing no solvent can be obtained.

Production of Heat-Dissipation Member

As one example, a method for producing a film as a heat-dissipation member using composition (1) for the heat-dissipation member, composition (1) containing no solvent will be specifically described.

Composition (1) for the heat-dissipation member, composition (1) containing no solvent is interposed between heating plates using a compression molding machine, and subjected to alignment molding by compression molding. A polymerizable liquid crystal compound is polymerized within or higher than the temperature range in which the compound exhibits a liquid crystal phase to form a polymer. Further, post-cure may be applied thereto at a suitable temperature for a suitable period of time. In addition, pressure during compression molding is preferably 50 to 200 kgf/cm$^2$, and further preferably 70 to 180 kgf/cm$^2$. Pressure during curing is basically preferably higher. However, the pressure is appropriately changed depending on fluidity of a mold or objective physical properties (emphasis on thermal conductivity in any direction, or the like), and suitable pressure is preferably applied.

Hereinafter, a method for producing a film as a heat-dissipation member using composition (1) for the heat-dissipation member, composition (1) containing a solvent will be specifically described.

First, composition (1) is applied onto a substrate, and the solvent is removed and dried to form a coated film layer having a uniform thickness. Specific examples of a coating method include a spin coating method, a roll coating method, a curtain coating method, a flow coating method, a printing method, a microgravure coating method, a gravure coating method, a wire bar coating method, a dip coating method, a spray coating method and a meniscus coating method.

Removal and drying of the solvent can be achieved by drying in air at room temperature, drying on a hot plate, drying in a drying oven or blowing warm air and hot air, for example. Conditions of solvent removal are not particularly limited, and drying only needs to be performed until the solvent is substantially removed and fluidity of the coated film layer is lost. In addition, molecular alignment of liquid crystal molecules in the coated film layer is completed in several cases in a process of drying the coated film layer depending on a kind and a composition ratio of compounds used in composition (1) for the heat-dissipation member. In such a case, the coated film layer passed through a drying step can be provided for a polymerization step without passing through a step of heat treatment mentioned above. However, in order to further uniformize alignment of the liquid crystal molecules in the coated film layer, heat treatment is, preferably, applied to the coated film layer passed through the drying step, and then polymerization treatment is applied thereto to immobilize the alignment.

Moreover, alignment treatment is preferably applied onto a substrate surface before composition (1) for the heat-dissipation member is applied thereonto. As an alignment treatment method, for example, an alignment film may be only formed on the substrate, and specific examples of the alignment treatment method include a method in which an alignment film is formed on a substrate, and then rubbing treatment is applied thereonto with a rayon fabric, a method in which rubbing treatment is directly applied onto a substrate with a rayon fabric, a method in which silicon oxide is obliquely deposited, and a method of rubbing-free alignment using a stretched film, a photoalignment film, or an ion beam. Moreover, a desired alignment state can also be formed without applying treatment onto the substrate surface in several cases. For example, when homeotropic alignment is formed, no surface treatment such as the rubbing treatment is applied in many cases, but the rubbing treatment may be applied in view of preventing an alignment defect or the like.

The alignment film is not particularly limited if the alignment film can control alignment of composition (1) for the heat-dissipation member, and a publicly-known alignment film can be used, and a polyimide, polyamide, polyvinyl alcohol, alkylsilane, alkylamine or lecithin alignment film is preferred.

An arbitrary method can be adopted in the rubbing treatment, and such a method is ordinarily adopted in which rubbing cloth formed of a raw material such as rayon, cotton and polyamide is wound around a metallic roll or the like, and is moved while rotating a roll in a state in contact with a substrate or an alignment film, a method in which the substrate is moved with a roll fixed, or the like.

Moreover, in order to achieve further uniform alignment, an alignment control additive may be incorporated into composition (1) for the heat-dissipation member. Specific examples of such an alignment control additive include imidazoline, quaternary ammonium salt, alkylamine oxide, a polyamine derivative, a polyoxyethylene-polyoxypropylene condensate, polyethyleneglycol and ester thereof, sodium lauryl sulfate, ammonium lauryl sulfate, lauryl sulfate amines, alkyl substituted aromatic sulfonate, alkyl phosphoric acid salt, an aliphatic or aromatic sulfonic acid formalin condensate, lauryl amidopropylbetaine, lauryl aminoacetic acid betaine, polyethyleneglycol fatty acid esters, polyoxyethylene alkylamine, perfluoroalkyl sulfonate, perfluoroalkyl carboxylate, a perfluoroalkyl ethylene oxide adduct, perfluoroalkyl trimethylammonium salt, an oligomer having a perfluoroalkyl group and a hydrophilic radical, an oligomer having a perfluoroalkyl group and a lipophilic group, urethane having a perfluoroalkyl group and an organosilicon compound having a primary amino group (organosilicon compound of alkoxysilane type, liner siloxane type and three-dimensionally-condenses silsesquioxane type, for example).

Alignment such as homogeneous alignment, homeotropic alignment, twist alignment, splay alignment and hybrid alignment can be obtained by appropriately selecting the substrate subjected to alignment treatment as described above, and interposing the composition for the heat-dissipation member with the substrate. Moreover, in addition to the method described above, alignment may be further arbitrarily controlled by applying electric field, a magnetic field or the like thereto.

Specific examples of the substrate include a glass substrate of alkaline glass, borosilicate glass, or flint glass; a metal substrate of aluminum, iron, or copper; an inorganic substrate of silicon; and a plastic film substrate of polyimide, polyamideimide, polyamide, polyetherimide, polyetheretherketone, polyether ketone, polyketone sulfide, polyethersulfone, polysulfone, polyphenylene sulfide, polyphenylene oxide, polyethylene terephthalate, polybutylene terephthalate, polyethylene naphthalate, polyacetal, polycarbonate, polyarylate, an acrylic resin, polyvinylalcohol, polypropylene, cellulose, triacetyl cellulose or partially saponified product thereof, an epoxy resin, a phenolic resin, or a norbornene resin.

The film substrate may be a uniaxially-stretched film or a biaxially-stretched film. To the film substrate, surface treatment such as saponification treatment, corona treatment and plasma treatment may be preliminarily applied. In addition, on the film substrates, a protective layer not corroded by a solvent contained in composition (1) described above for the heat-dissipation member may be formed. Specific examples of a material used as the protective layer include polyvinyl alcohol. Further, in order to improve adhesion between the protective layer and the substrate, an anchor coat layer may be formed thereon. Such an anchor coat layer may be formed of any of an inorganic material and an organic material if the adhesion between the protective layer and the substrate is improved.

The heat-dissipation member of the invention is useful in a heat-dissipation plate, a heat-dissipation sheet, a heat-dissipation film, a heat-dissipation adhesive, a heat-dissipation molded product or the like.

Electronic Equipment

Electronic equipment according to a third embodiment of the invention is equipped with the heat-dissipation member according to the second embodiment, and an electronic device having a heating unit. The heat-dissipation member is arranged in the electronic device so as to be brought into contact with the heating unit. A shape of the heat-dissipation member may be any of the heat-dissipation plate, the heat-dissipation sheet, the heat-dissipation film, the heat-dissipation adhesive, the heat-dissipation molded product or the like.

Specific examples of the electronic device include a semiconductor device. The heat-dissipation member of the present application has high heat resistance and high insulation, in addition to high thermal conductivity. Therefore, the heat-dissipation member is particularly effective in an Insulated Gate Bipolar Transistor (IGBT) that requires a further efficient heat-dissipation mechanism because of high electric power among the semiconductor devices. The IGBT is one of the semiconductor devices, and a bipolar transistor having MOSFET assembled in a gate unit, and is used in an application of power control. Specific examples of the electronic device equipped with IGBT include a main converting device of a high-power inverter, an uninterruptible power system, a variable voltage variable frequency control apparatus of an alternating current motor, a control apparatus of a railroad vehicle, a hybrid vehicle, an electric transport machine such as an electric vehicle, and an IH cooker.

EXAMPLES

Hereinafter, the invention will be described in detail by way of Examples. However, the invention is not limited to the content described in Examples described below.

A component material that were used in Examples of the invention and formed of a heat-dissipation member is as described below.
Polymerizable Liquid Crystal Compound
Liquid crystalline epoxy: formula (4-1) described below (made by JNC Corporation)
In addition, the compound can be prepared by a method described in JP 5084148 B.

Formula 19

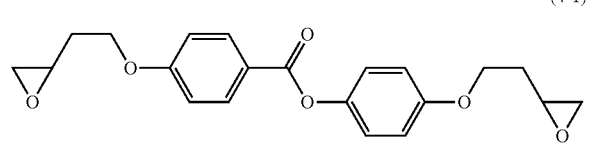

(4-1)

Polymerizable Compound
Epoxy: jER828 (made by Mitsubishi Chemical Corporation)
Curing Agent
Amine curing agent 1: 4,4'-diamino-1,2-diphenylethane (made by Wako Pure Chemical Industries, Ltd.)
Amine curing agent 2: 4,4'-diamino-1,2-diphenylmethane (made by Wako Pure Chemical Industries, Ltd.)
Amine curing agent 3: jER113 (made by Mitsubishi Chemical Corporation)
Amine curing agent 4: EDR148 (made by Mitsui Fine Chemicals, Inc.)
Filler
Boron nitride: h-BN particles (made by Momentive Performance Materials Japan LLC, (trade name) PolarTherm PTX-25)

Silane Coupling Agent
Octadecyltriethoxysilane (made by AZmax.co)
3-aminopropyltrimethoxysilane (made by Shin-Etsu Chemical Co., Ltd., (trade name) KBM-903)
Preparation of Heat-Dissipation Member
An example of preparation of a heat-dissipation member is shown below (amounts described below correspond to amounts in Examples 35 and 36).
Arrangement of Coupling Agent Treated-Boron Nitride Particles
To 50 mL of toluene (anhydrous), 5.0 g of boron nitride particles (PTX25, hereinafter, abbreviated as BN) and 0.75 g of 3-aminopropyltrimethoxysilane were added, the resulting mixture was stirred using a stirrer at 750 rpm for 1 hour, and the resulting mixture was dried at 40° C. for 5 hours, and at room temperature for 19 hours. Further, a solvent was dried, and then the resulting mixture was heat treated using a vacuum dryer set to 125° C. for 5 hours under vacuum conditions.

The BN particles modified with the coupling agent were transferred into a sample tube, and 50 mL of THF (made by Nacalai Tesque, Inc.) was added thereto, and then the resulting mixture was pulverized by supersonic treatment (MODEL 450 made by Branson Ultrasonics, Emerson Japan, Ltd.). Further, the resulting solution was separated and purified using a centrifuge (CT6E made by Hitachi Koki Co., Ltd.) at 6,000 rpm for 10 minutes. A supernatant was disposed of, and then 50 mL of acetone was added thereto, and similar operation was performed twice. The BN particles modified therewith after being purified were dried in an oven at 60° C. for 24 hours.

The coupling agent-treated BN particles and a liquid crystalline epoxy were measured on wrapping paper, by 2 g and 4 g (19 vol % in a formulation ratio of BN), respectively, and mixed using a mortar, and then the resulting mixture was kneaded using a twin-screw roll (HR-3 made by Nitto Hannoki K.K.) at 120° C. for 10 minutes Then, the resulting mixture was separated and purified by supersonic treatment and centrifugation to obtain the BN particles modified with the coupling agent, from which an unreacted component was removed. Moreover, a coated amount was calculated from heating loss at 600° C. of the prepared BN particles modified with the coupling agent, using a TG-DTA apparatus (EXSTAR TG-DTA 5200 made by Seiko Instruments Inc.).
Mixture with Diamine
The prepared BN particles modified with a silane coupling agent, a liquid crystalline epoxy and amine curing agent 1 (DDET) were mixed by 4.38 g, 0.34 g and 0.1 g, respectively, with an agate mortar, and then the resulting mixture was kneaded at 55° C. for 10 minutes using a twin-screw roll.
Polymerization and Molding
The resulting mixture was interposed between stainless steel plates, pressurized up to 9.8 MPa by using a compression molding machine (F-37 made by SHINTO Metal Industries Corporation) set to 150° C., and alignment treatment and pre-cure were applied thereto by continuing a heated state for 15 minutes. More specifically, when the mixture spread between the stainless steel plates, the liquid crystalline epoxies were aligned in a spreading direction. Moreover, an amount of a sample was adjusted to be about 200 μm in thickness. Further, post-cure was applied at 80° C. for 1 hour, and at 150° C. for 3 hours by using an oven, and the resulting material was taken as an objective heat-dissipation member of the invention.

Evaluation of Thermal Conductivity and Thermal Diffusivity

With regard to thermal conductivity, specific heat of a heat-dissipation member (measured by DSC type input compensation type differential scanning calorimeter EXSTAR6000 made by Seiko Instruments Inc.) and specific gravity (measured by gravimeter AG204 density measurement kit made by Mettler-Toledo International Inc.) were preliminarily determined, and the values were multiplied by thermal diffusivity determined by TC7000 thermal-diffusivity measuring apparatus made by ULVAC-RIKO, Inc. to determine the thermal conductivity. In addition, thermal diffusivity in a thickness direction was measured by applying blackening treatment to a sample by using a carbon spray, and using a standard sample holder. Moreover, thermal diffusivity in a plane direction was measured by preparing an adapter for separating a distance, by 5 mm, between a spot to which a laser beam was irradiated, and a spot from which infrared light was detected, and then calculated from a period of time from irradiating the sample with the laser beam to emission of infrared light, and a distance thereof.

In Examples 1 to 13, in "Preparation of heat-dissipation member" described above, a heat-dissipation member was prepared using unmodified BN particles (PTX25). Thermal conductivity is shown below.

Figure 3A:
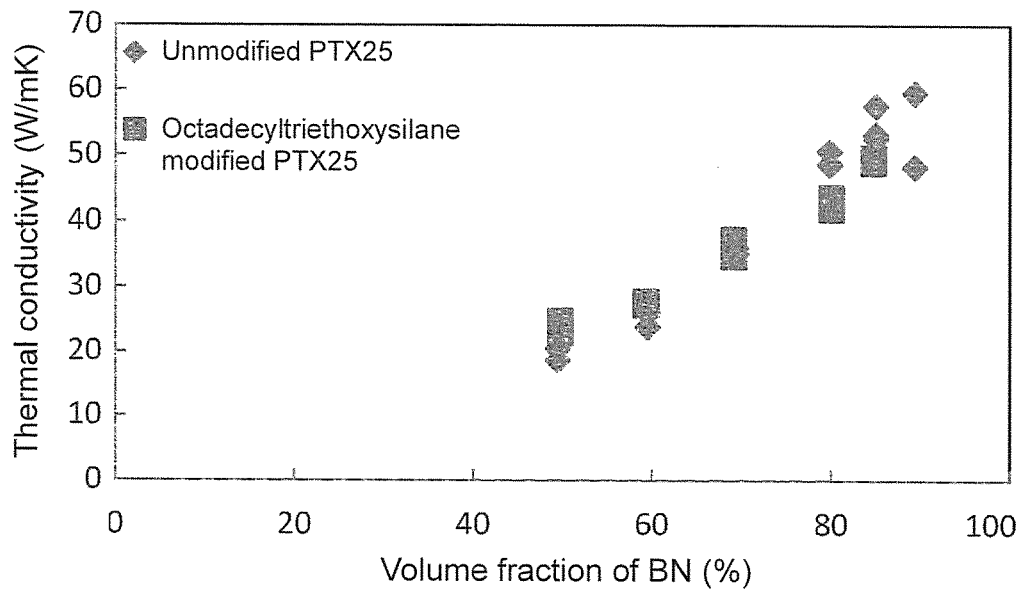
Figure 3B:
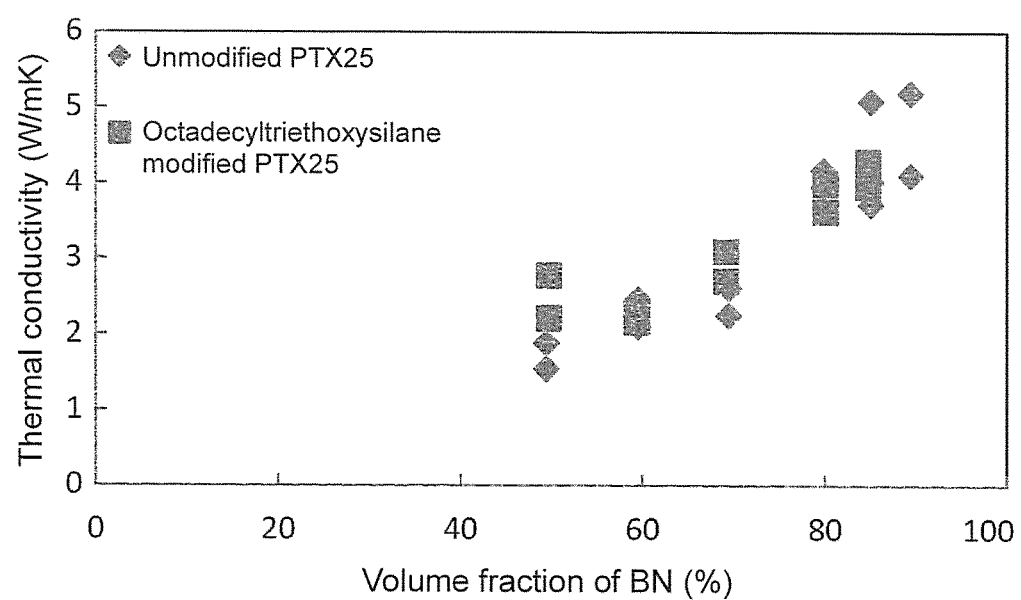
Figure 4A:
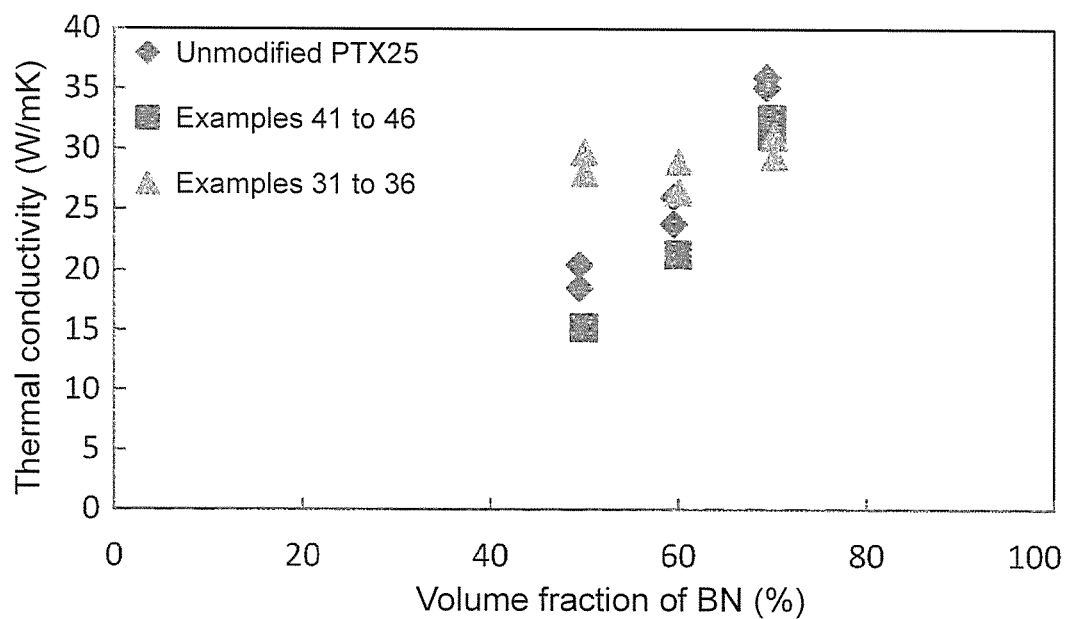
Figure 4B:
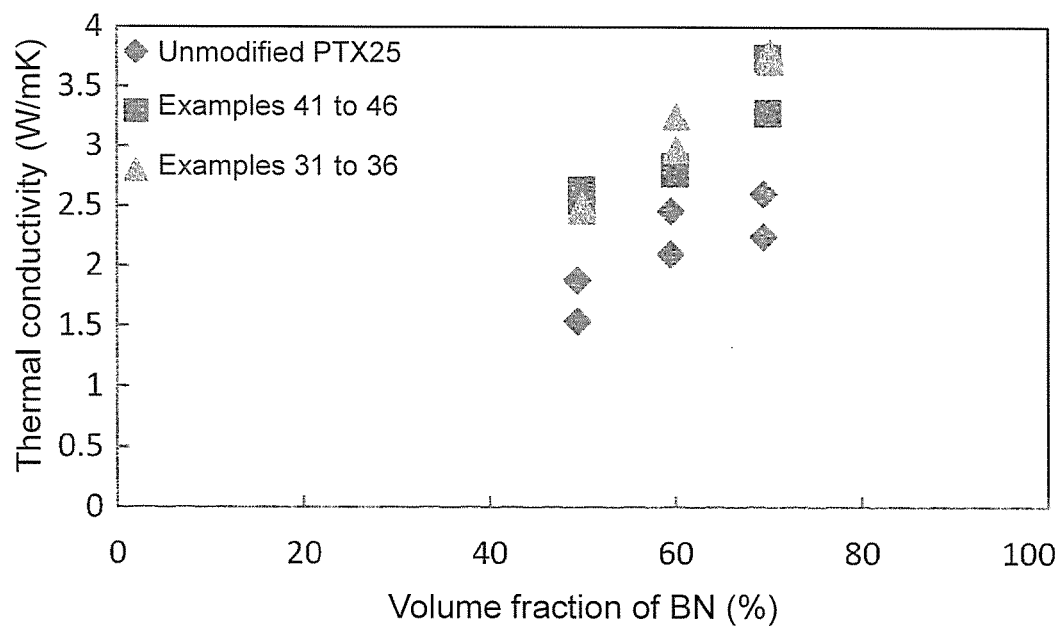

Moreover, a relationship between a volume fraction of unmodified BN particles and thermal conductivity is shown in graphs in FIGS. 3(a), 3(b), 4(a) and 4(b). In FIGS. 3(a), 3(b), 4(a) and 4(b), FIGS. 3(a) and 4(a) show thermal conductivity in an x-y direction, and FIGS. 3(b) and 4(b) show thermal conductivity in a thickness direction.

Moreover, when a similar evaluation was conducted using a bisphenol type epoxy (jER828) in place of a liquid crystalline epoxy in Example 1 (Comparative Example 1), thermal conductivity in an x-y direction was only 14.5 W/mK.

TABLE 1

Unmodified BN particles

| Sample name | Actual composition | Thermal conductivity in x-y direction (W/mK) | Thermal conductivity in thickness direction (W/mK) |
| --- | --- | --- | --- |
| Example 1 | 50vol-1 | 0.495 | 18.5 | 1.88 |
| Example 2 | 50vol-2 | 0.495 | 20.4 | 1.54 |
| Example 3 | 60vol-1 | 0.596 | 23.8 | 2.09 |
| Example 4 | 60vol-2 | 0.596 | 26.0 | 2.46 |
| Example 5 | 70vol-1 | 0.695 | 35.1 | 2.24 |
| Example 6 | 70vol-2 | 0.695 | 36.0 | 2.60 |
| Example 7 | 80vol-1 | 0.799 | 48.5 | 4.17 |
| Example 8 | 80vol-2 | 0.799 | 50.5 | 3.95 |
| Example 9 | 85vol-1 | 0.850 | 53.1 | 4.02 |
| Example 10 | 85vol-2 | 0.850 | 52.6 | 5.08 |
| Example 11 | 85vol-3 | 0.850 | 57.5 | 3.72 |
| Example 12 | 90vol-1 | 0.894 | 59.5 | 5.19 |
| Example 13 | 90vol-2 | 0.894 | 48.1 | 4.10 |
| Comparative Example 1 | — | — | 14.5 | — |

In Examples 21 to 30, in "Preparation of heat-dissipation member" described above, a heat-dissipation member was prepared using octadecyltriethoxysilane-treated BN particles. Thermal conductivity is shown below. A modified amount is expressed in terms of an amount based on 100% by weight of a total of BN particles and octadecyltriethoxysilane.

Moreover, a relationship between a volume fraction of BN particles and thermal conductivity is shown in graphs in FIGS. 3(a) and 3(b). In FIGS. 3(a) and 3(b), FIG. 3(a) shows thermal conductivity in an x-y direction, and FIG. 3(b) shows thermal conductivity in a thickness direction.

TABLE 2

PTX25 modified with 1.9% by weight of octadecyltriethoxysilane

| Sample name | Actual composition | Thermal conductivity in x-y direction (W/mK) | Thermal conductivity in thickness direction (W/mK) |
| --- | --- | --- | --- |
| Example 21 | 50vol-1 | 0.497 | 24.8 | 2.20 |
| Example 22 | 50vol-2 | 0.497 | 22.8 | 2.77 |
| Example 23 | 60vol-1 | 0.594 | 27.2 | 2.15 |
| Example 24 | 60vol-2 | 0.594 | 27.7 | 2.27 |
| Example 25 | 70vol-1 | 0.692 | 37.4 | 3.09 |
| Example 26 | 70vol-2 | 0.692 | 34.6 | 2.70 |
| Example 27 | 80vol-1 | 0.801 | 41.9 | 3.99 |
| Example 28 | 80vol-2 | 0.801 | 43.5 | 3.61 |
| Example 29 | 85vol-1 | 0.847 | 49.6 | 3.95 |
| Example 30 | 85vol-2 | 0.847 | 48.9 | 4.27 |

In Examples 31 to 36, in "Preparation of heat-dissipation member" described above, a heat-dissipation member was prepared using BN particles subjected to treatment with 3-aminopropyltrimethoxysilane and further surface modification with a liquid crystalline epoxy. Thermal conductivity is shown below. A modified amount is expressed in terms of an amount based on 100% by weight of a total of BN particles, KBM903 and the liquid crystalline epoxy.

Moreover, a relationship between a volume fraction of BN particles and thermal conductivity is shown in graphs in FIGS. 4(a) and 4(b). In FIGS. 4(a) and 4(b), FIG. 4(a) shows thermal conductivity in an x-y direction, and FIG. 4(b) shows thermal conductivity in a thickness direction.

TABLE 3

PTX25 (somewhat smaller thickness) modified with 4.1% by weight of KBM903 and 6.0% by weight of liquid crystalline epoxy

| Sample name | Actual composition | Thermal conductivity in x-y direction (W/mK) | Thermal conductivity in thickness direction (W/mK) |
| --- | --- | --- | --- |
| Example 31 | 50vol-1 | 0.500 | 28.0 | 2.46 |
| Example 32 | 50vol-2 | 0.500 | 29.7 | 2.50 |
| Example 33 | 60vol-1 | 0.601 | 26.4 | 3.25 |
| Example 34 | 60vol-2 | 0.601 | 29.0 | 2.97 |
| Example 35 | 70vol-1 | 0.702 | 31.1 | 3.71 |
| Example 36 | 70vol-2 | 0.702 | 29.4 | 3.78 |

In Examples 41 to 46, in "Preparation of heat-dissipation member" described above, a heat-dissipation member was prepared using BN particles subjected to treatment with 3-aminopropyltrimethoxysilane and further surface modification with a liquid crystalline epoxy. Thermal conductivity is shown below. A modified amount is expressed in Willis of an amount based on 100% by weight of a total of BN particles, KBM903 and the liquid crystalline epoxy.

Moreover, a relationship between a volume fraction of BN particles and thermal conductivity is shown in graphs in FIGS. 4(a) and 4(b). In FIGS. 4(a) and 4(b), FIG. 4(a) shows thermal conductivity in an x-y direction, and FIG. 4(b) shows thermal conductivity in a thickness direction.

TABLE 4

PTX25 (somewhat higher thickness) modified with 4.1% by weight of KBM903 and 6.0% by weight of liquid crystalline epoxy

| Sample name | Actual composition | Thermal conductivity in x-y direction (W/mK) | Thermal conductivity in thickness direction (W/mK) |
|---|---|---|---|
| Example 41 | 50vol-1 | 0.499 | 15.3 | 2.55 |
| Example 42 | 50vol-2 | 0.499 | 15.2 | 2.63 |
| Example 43 | 60vol-1 | 0.600 | 21.3 | 2.77 |
| Example 44 | 60vol-2 | 0.600 | 21.2 | 2.83 |
| Example 45 | 70vol-1 | 0.700 | 31.1 | 3.74 |
| Example 46 | 70vol-2 | 0.700 | 32.6 | 3.28 |

As shown in FIGS. 3(a), 3(b), 4(a) and 4(b), in the heat-dissipation member prepared using unmodified boron nitride particles, and the heat-dissipation member prepared using silane coupling agent-treated boron nitride particles, as an amount of boron nitride particles was larger, thermal conductivity was higher, and values thereof were significantly higher in both an x-y (plane) direction and a thickness direction, in comparison with a heat-dissipation member formed of the polymerizable epoxy having no liquid crystallinity, and boron nitride particles. For example, thermal conductivity in the x-y direction was only 14.5 W/mK in Comparative Example 1 (epoxy), and thermal conductivity was higher in Example 1 (epoxy having liquid crystallinity).

As shown in FIG. 4(b), thermal conductivity in the thickness direction is higher in the heat-dissipation member prepared using boron nitride particles subjected to coupling modification or surface modification, in comparison with the heat-dissipation member prepared using unmodified boron nitride particles. Such results are considered to be caused because modified molecules around the modified boron nitride particles adversely affected flow alignment of a liquid crystal polymer during high shearing, force in the thickness direction acted on the modified boron nitride particles to improve the thermal conductivity in the thickness direction.

In Examples 51 to 53 and Comparative Example 2, in "Preparation of heat-dissipation member" described above, a heat-dissipation member was prepared using curing agents different from each other without containing BN particles (PTX25).

When the heat-dissipation member was prepared by changing diamine from amine curing agent 1 to amine curing agents 2 to 4, air bubbles entered therein in a part of a sample, and density was unmeasurable, and therefore an evaluation was made in terms of thermal diffusivity (Example 51 to 53, Comparative Example 2). Use of diamine as represented by formula (3-1) resulted in higher heat-dissipation performance.

TABLE 5

| | Thermal diffusivity |
|---|---|
| | Thermal diffusivity in x-y direction ($\times 10^{-3}$ cm$^2$/s) |
| Example 51 (amine curing agent 1) | 1.89 |
| Example 52 (amine curing agent 2) | 1.86 |
| Example 53 (amine curing agent 3) | 1.82 |
| Comparative Example 2 (amine curing agent 4) | 1.61 |

Publications cited herein, all of the references, including patent applications and patents, individually and specifically indicated to each document, and incorporate by reference, and forth in its entirety herein in the same extent, incorporated by reference herein.

Use of the noun and the similar directive used in connection with the description (particularly with reference to the following claims) in the present invention, or particularly pointed out herein, unless otherwise indicated herein or otherwise clearly contradicted by context, is to be construed to cover both the singular form and the plural form. The terms "comprising," "having," "including" and "containing," unless otherwise noted, be construed as open-ended terms (namely, meaning "including, but not limited to"). Recitations of numerical ranges herein, unless otherwise indicated herein, is intended merely to serve as shorthand for referring individually each value falling within its scope and which, each value, as if it were individually recited herein, are incorporated herein. All of the methods described herein, or particularly pointed out herein, unless otherwise indicated herein or otherwise clearly contradicted by context, can be performed in any suitable order. The use of any and all examples, or exemplary language ("such as") provided herein, is intended merely to better illuminate the invention and does not pose a limitation on the scope of the invention unless otherwise claimed. No language herein should be construed as indicating any non-claimed element as essential to the practice of the invention.

Preferred embodiments of the invention are described herein, including the best modes known to the present inventors for carrying out the invention. Variations of the preferred embodiments may become apparent to those having ordinary skill in the art upon reading the foregoing description. The present inventors expect skilled artisans to employ such variations as appropriate, and the present inventors intend for the invention to be practiced otherwise than as specifically described herein. Accordingly, the invention includes all modifications and equivalents of the subject matters recited in the claims appended hereto as permitted by applicable laws. Further, particularly pointed out herein, unless otherwise indicated or otherwise clearly contradicted by context, any combination of the above-described elements in all possible variations thereof is encompassed by the invention.

What is claimed is:

1. A composition for a heat-dissipation member, comprising:
   a polymerizable liquid crystal compound having, at both terminals, a structure including an oxiranyl group or an oxetanyl group;
   a curing agent that cures the polymerizable liquid crystal compound; and
   an inorganic filler formed of nitride;
   wherein curing temperature is within or higher than the temperature range in which the polymerizable liquid crystal compound exhibits a liquid crystal phase, and within or lower than the temperature range in which the polymerizable liquid crystal compound exhibits an isotropic phase, and
   the curing agent is at least one kind of diamine compound represented by formula (3-1) described below:

$$H_2N-Z-(A-Z)_{m2}-NH_2 \tag{3-1}$$

wherein, in formula (3-1) described above,
   A is 1,4-cyclohexylene or 1,4-phenylene, and arbitrary hydrogen in the rings may be replaced by halogen or alkyl having 1 to 10 carbons;

Z each is a single bond or alkylene having 1 to 10 carbons; and m2 is an integer from 1 to 7.

2. The composition for the heat-dissipation member according to claim 1, wherein the polymerizable liquid crystal compound is at least one kind of compound represented by formula (1-1) described below:

$$R^{a1}\text{—}Z\text{-}(A\text{-}Z)_{m1}\text{—}R^{a1} \quad (1\text{-}1)$$

wherein, in formula (1-1) described above, $R^{a1}$ each is a polymerizable group represented by any one of formulas (2-1) to (2-2) described below;

A is 1,4-cyclohexylene, 1,4-cyclohexenylene, 1,4-phenylene, naphthalene-2,6-diyl, tetrahydronaphthalene-2,6-diyl, fluorene-2,7-diyl, bicyclo[2.2.2]oct-1,4-diyl or bicyclo[3.1.0]hex-3,6-diyl, and in the rings, arbitrary —CH$_2$— may be replaced by —O—, arbitrary —CH= may be replaced by —N=, and arbitrary hydrogen may be replaced by halogen, alkyl having 1 to 10 carbons or alkyl halide having 1 to 10 carbons, and in the alkyl, arbitrary —CH$_2$— may be replaced by —O—, —CO—, —COO— or —OCO—, and arbitrary —CH$_2$CH$_2$— may be replaced by —CH=CH— or —C≡C—;

Z each is a single bond or alkylene having 1 to 20 carbons, and in the alkylene, arbitrary —CH$_2$— may be replaced by —O—, —S—, —CO—, —COO— or —OCO—, arbitrary —CH$_2$CH$_2$— may be replaced by —CH—CH—, —CF—CF—, —CH=N—, —N=CH—, —N=N—, —N(O)=N— or —C≡C—, and arbitrary hydrogen may be replaced by halogen; and m1 is an integer from 1 to 6:

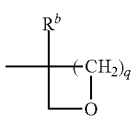
(2-1)

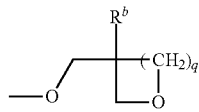
(2-2)

wherein, in formulas (2-1) to (2-2), $R^b$ is hydrogen, halogen, —CF$_3$ or alkyl having 1 to 5 carbons, and q is 0 or 1.

3. The composition for the heat-dissipation member according to claim 2, wherein, in formula (1-1) described above, A is 1,4-cyclohexylene, 1,4-cyclohexylene in which arbitrary hydrogen is replaced by halogen, 1,4-phenylene, 1,4-phenylene in which arbitrary hydrogen is replaced by halogen or a methyl group, fluorene-2,7-diyl, or fluorene-2,7-diyl in which arbitrary hydrogen is replaced by halogen or a methyl group.

4. The composition for the heat-dissipation member according to claim 3, wherein, in formula (1-1), Z is a single bond, —(CH$_2$)$_a$—, —O(CH$_2$)$_a$—, —(CH$_2$)$_a$O—, —O(CH$_2$)$_a$O—, —CH=CH—, —C≡C—, —COO—, —OCO—, —CH=CH—COO—, —OCO—CH=CH—, —CH$_2$CH$_2$—COO—, —OCO—CH$_2$CH$_2$—, —CH=N—, —N=CH—, —N=N—, —OCF$_2$— or —CF$_2$O—, and a is an integer from 1 to 20.

5. The composition for the heat-dissipation member according to claim 1, wherein the inorganic filler is at least one selected from boron nitride, aluminum nitride and silicon nitride.

6. The composition for the heat-dissipation member according to claim 1, wherein the inorganic filler is a filler subjected to treatment with a coupling agent, or a filler subjected to coupling treatment and then surface modification with the polymerizable liquid crystal compound.

7. A heat-dissipation member, obtained by curing the composition for the heat-dissipation member according to claim 1 after applying alignment treatment thereto, and containing 20 to 95% by weight of the inorganic filler.

8. Electronic equipment, comprising:
the heat-dissipation member according to claim 7; and
an electronic device having a heating unit;
wherein the heat-dissipation member is arranged in the electronic device in such a manner that the heat-dissipation member is brought into contact with the heating unit.

* * * * *